(12) United States Patent
Sasaki et al.

(10) Patent No.: US 7,247,203 B2
(45) Date of Patent: Jul. 24, 2007

(54) PROCESS FOR PRODUCING CRYSTALLINE NUCLEUS AND METHOD OF SCREENING CRYSTALLIZATION CONDITIONS

(75) Inventors: Takatomo Sasaki, Suita (JP); Yusuke Mori, Suita (JP); Masashi Yoshimura, Suita (JP); Hiroaki Adachi, Suita (JP); Hiroshi Masuhara, Suita (JP); Youichiroh Hosokawa, Suita (JP); Kazufumi Takano, Suita (JP)

(73) Assignee: Osaka Industrial Promotion Organization, Osaka (JP)

( * ) Notice: Subject to any disclaimer, the term of this patent is extended or adjusted under 35 U.S.C. 154(b) by 364 days.

(21) Appl. No.: 10/525,809

(22) PCT Filed: Aug. 25, 2003

(86) PCT No.: PCT/JP03/10681

§ 371 (c)(1),
(2), (4) Date: Feb. 25, 2005

(87) PCT Pub. No.: WO2004/018744

PCT Pub. Date: Mar. 4, 2004

(65) Prior Publication Data

US 2005/0241568 A1 Nov. 3, 2005

(30) Foreign Application Priority Data

| Aug. 26, 2002 | (JP) | ............................ 2002-245700 |
| Dec. 27, 2002 | (JP) | ............................ 2002-382617 |
| Mar. 26, 2003 | (JP) | ............................ 2003-086561 |
| Jul. 11, 2003 | (JP) | ............................ 2003-273685 |

(51) Int. Cl.
*C30B 29/54* (2006.01)
(52) U.S. Cl. ............................ 117/68; 117/69; 117/70; 117/904; 117/925; 117/926; 117/927

(58) Field of Classification Search ................. 117/68, 117/69, 70, 904, 925, 926, 927
See application file for complete search history.

(56) References Cited

U.S. PATENT DOCUMENTS 7,160,820 B2 * 1/2007 Suga et al. .................. 438/779
2005/0181464 A1 * 8/2005 Edwards et al. ........... 435/7.32

FOREIGN PATENT DOCUMENTS

| JP | 2002-68899 | 3/2002 |
| JP | 2003-306497 | 10/2003 |

OTHER PUBLICATIONS

Adachi, et al., "Laser Irradiated Growth of Protein Crystal", Jpn. J. Appl. Phys., vol. 42 (2003), pp. L798-L800.
Bancel, et al., "Laser seeding for biomolecular crystallization", Journal of Crystal Growth 191 (1998) 537-544.
Preuss, et al., "Time resolved dynamics of subpicosescond laser ablation ", Appl. Phys. Lett. 62 (23), Jun. 7, 1993, pp. 3049-3051.
Garetz, et al., "Nonphotochemical, Polarization-Dependent, Laser-Induced Nucleation in Supersaturated Aqueous Urea Solutions", vol. 77, No. 16, Oct. 14, 1996, pp. 3475-3476.

* cited by examiner

*Primary Examiner*—Robert Kunemund
(74) *Attorney, Agent, or Firm*—Hamre, Schumann, Muller & Larson, P.C.

(57) ABSTRACT

The present invention relates to a process for producing high-quality crystals of protein or organic substances easily and efficiently. A solution of protein or an organic substance is prepared and then is cooled slowly to be supersaturated to a low degree. This supersaturated solution is irradiated with a femtosecond laser 10. A local explosion phenomenon occurs at the focal point of the laser and thereby a crystalline nucleus is generated. A high-quality crystal is obtained when a crystal is grown on the crystalline nucleus over a long period of time. The femtosecond laser to be used herein can be a titanium:sapphire laser having a wavelength of 800 nm, a duration of 120 fs, a frequency of 1 kHz, and an output of 400 mW.

17 Claims, 18 Drawing Sheets

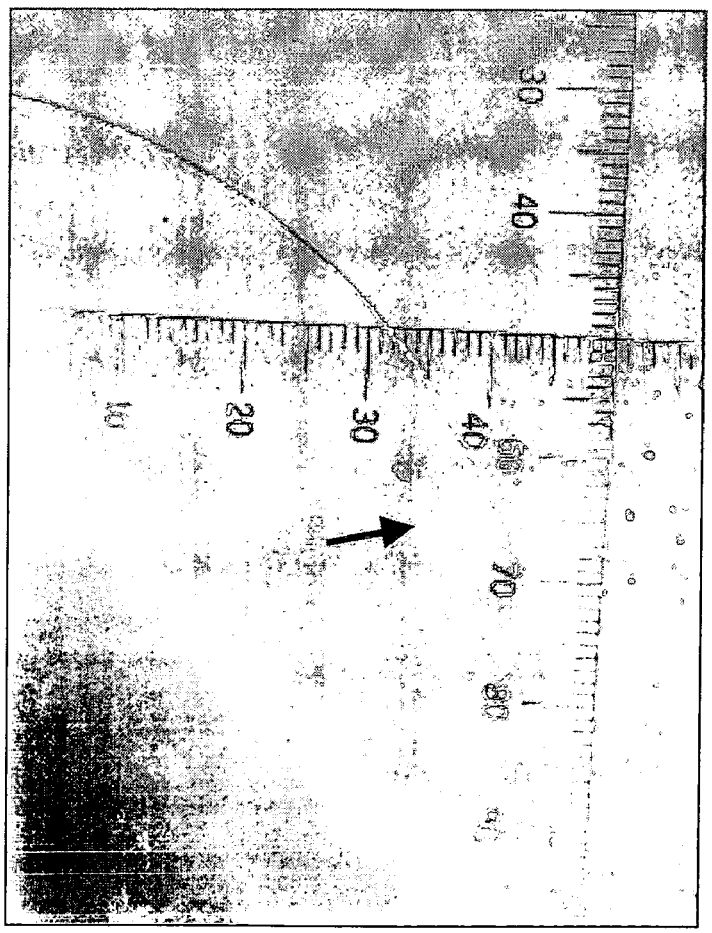
FIG. 11

FIG.15A
FIG.15B
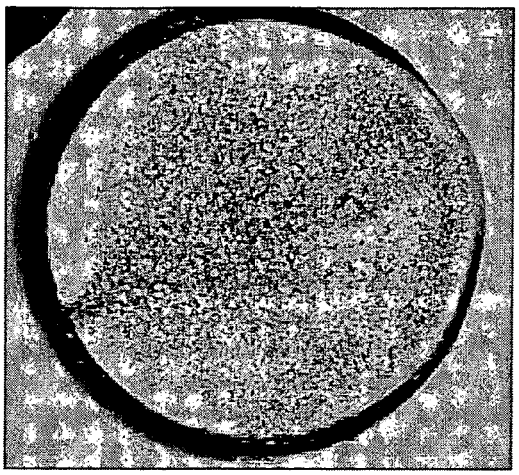
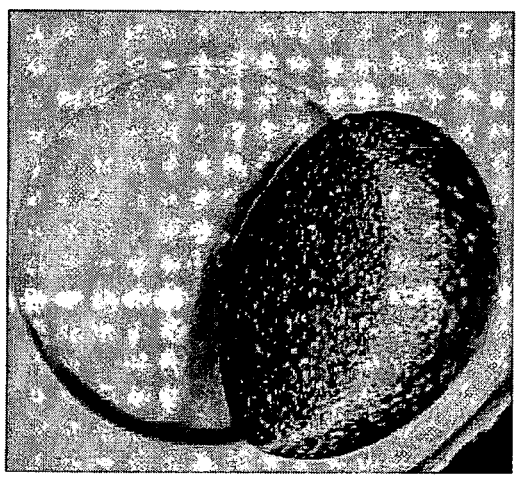
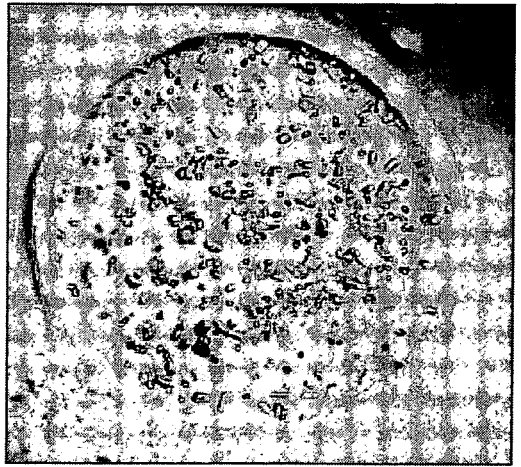
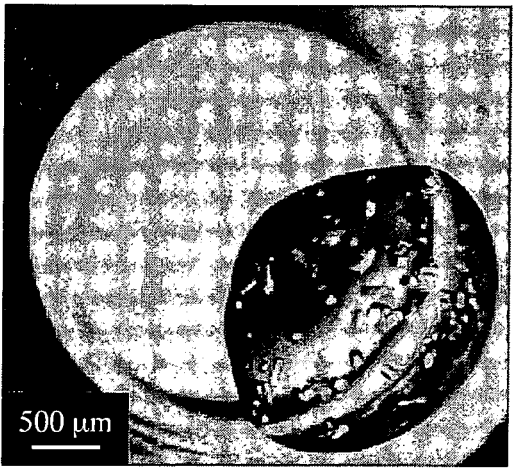
FIG.15C
FIG.15D

PROCESS FOR PRODUCING CRYSTALLINE NUCLEUS AND METHOD OF SCREENING CRYSTALLIZATION CONDITIONS

TECHNICAL FIELD

The present invention relates to a process for producing a crystalline nucleus and a method of screening crystallization conditions.

BACKGROUND ART

With the progress of post-genome studies, it has become necessary to analyze the protein structure urgently. In order to do that, however, it is necessary to crystallize protein. Furthermore, organic crystals are considered as promising next-generation device materials. Accordingly, there are great needs for the technique of producing high-quality organic crystals. Generally, in order to deposit crystals from a solution, it is necessary to increase the degree of supersaturation through solvent evaporation, a temperature change, etc. However, a substance with a high molecular weight such as an organic substance or protein is not crystallized unless the supersaturation degree is extremely high. Once crystallization takes place in such a solution whose supersaturation degree is extremely high, the crystal grows rapidly. Hence, there is a possibility that the crystal to be obtained thereby may have a problem in its quality. Furthermore, such a high-molecular-weight substance generally is difficult to crystallize, which results in low productivity. Usually, crystallization conditions are determined as a result of trial and error through actual attempts of crystallization. This, however, is too complicated to be practical in the case of substances such as protein, an organic substance, etc. that must be crystallized. There is an attempt to produce an organic crystal using a nanosecond Nd:YAG laser (Physical Review Letters 77 (1996) p3475; JP2002-068899). In this method, however, crystallization is not achieved satisfactorily and it is particularly difficult to crystallize protein.

DISCLOSURE OF THE INVENTION

The present invention was made in consideration of such situations. A first object of the present invention is to provide a technique that allows high-quality crystals to be produced easily and efficiently. A second object of the present invention is to provide a technique that allows crystallization conditions to be determined easily.

In order to achieve the first object, a process for producing a crystalline nucleus of the present invention is a process for generating a crystalline nucleus by irradiating a solution in which a solute to be crystallized has dissolved, with at least one pulsed laser selected from a picosecond pulsed laser and a femtosecond pulsed laser.

In this manner, when the solution is irradiated with the pulsed laser, a crystalline nucleus is generated even in a solution that has been supersaturated to a low degree. Accordingly, a crystal can be grown slowly on the crystalline nucleus. As a result, a high-quality crystal can be produced easily and efficiently. The process of the present invention is most suitable for the crystallization of protein and organic substances but also can be used for crystallization of other substances.

In order to achieve the second object, the method of screening crystallization conditions of the present invention is a method including: irradiating a solution in which a solute to be crystallized has dissolved, with at least one pulsed laser selected from a picosecond pulsed laser and a femtosecond pulsed laser; and at least one of judging whether a crystalline nucleus has been generated by the laser irradiation and judging whether the solute has been altered by the laser irradiation.

In this manner, an observation is made about whether a crystalline nucleus has been generated after the pulsed laser irradiation, and thereby the conditions of the solution, etc. can be judged to be suitable for crystallization if a crystalline nucleus has been generated. On the other hand, the state of the solute is observed after the pulsed laser irradiation, and thereby the conditions of the solution, etc. can be judged to be suitable for crystallization if the solute has altered. In the case of protein, the alteration of the solute is, for instance, an alteration (denaturation) in three dimensional structure.

When a supersaturated solution is irradiated with at least one pulsed laser selected from a picosecond pulsed laser and a femtosecond pulsed laser, a crystalline nucleus is generated. The mechanism thereof, however, is unknown. With respect to this, the present inventors presume as follows. That is, since high-density photons may concentrate at the focal point of the pulsed laser, a phenomenon (multiphoton absorption) in which several photons collide against one solute molecule or solvent molecule and it then absorbs light occurs with a high probability. As a result, when the pulsed laser is focused, an explosion phenomenon (laser ablation) is induced at the focal point due to the abrupt optical absorption. Conceivably, this serves as a perturbation to cause the crystalline nucleus generation. The following three mechanisms can be considered as the mechanism subsequent to this.

(1) The pulsed laser causes the photothermal conversion to evaporate the solution instantaneously in the vicinity of the focal point and thereby the solute is concentrated, which results in crystalline nucleus generation.

(2) Impulse waves are generated by ablation induced by the pulsed laser, and thereby the solution is rocked locally, which results in crystalline nucleus generation.

(3) Stimulated scattering is caused in the solution when the laser has an increased pulse energy, and thereby a concentration gradient is produced in the solution, which results in crystalline nucleus generation.

As described above, with the present invention, a crystalline nucleus can be generated easily and efficiently even from protein or an organic substance that is difficult to crystallize, and a high-quality crystal can be obtained when the crystalline nucleus is allowed to grow slowly. Furthermore, with the present invention, crystallization conditions can be screened and thereby can be determined quickly.

BRIEF DESCRIPTION OF DRAWINGS

FIG. 11 shows micrographs of protein crystals produced in yet another example of the present invention.

FIGS. 15A and 15B show micrographs of crystals obtained by a conventional method while FIGS. 15C and 15D show micrographs of crystals obtained in Reference Example 2 described above.

BEST MODE FOR CARRYING OUT THE INVENTION

Figure 1:
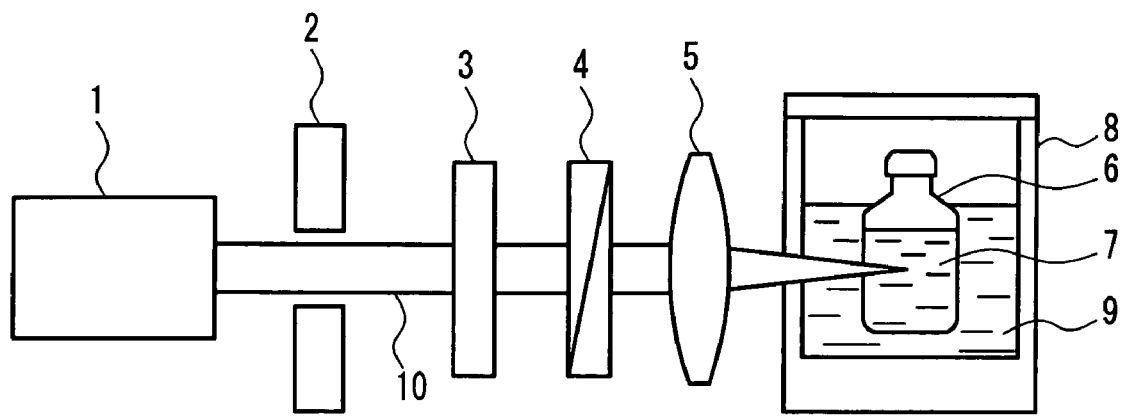
FIG. 1 is a diagram showing the configuration of a laser irradiation apparatus used in an example of the present invention.

Now, the present invention is described further in detail.

As described above, in the present invention, it is preferable that at least one pulsed laser selected from a picosecond pulsed laser and a femtosecond pulsed laser be focused in the solution with a lens to cause a single or multiple local explosion phenomena at the focal point and thereby generate a crystalline nucleus. It also is preferable that the solute be altered by the explosion phenomena.

In the present invention, the pulse peak power (photon flux) of the pulsed laser is, for instance, at least $5 \times 10^5$ (watt), preferably at least $2 \times 10^9$ (watt). The upper limit of the pulse peak power of the pulsed laser is not particularly limited but is, for instance, not higher than $10^{18}$ (watt), preferably not higher than $10^{15}$ (watt), and more preferably not higher than $10^{12}$ (watt).

As described later, since the product of the laser pulse energy (W) and the duration ($\Delta t$) is the pulse peak power (I), the laser conditions can be set depending on the duration as follows, for example. In this case, a picosecond pulsed laser and a femtosecond pulsed laser can be used as the pulsed laser, but among them, the femtosecond pulsed laser is particularly preferable.

| | Pulse Duration (second) | Laser Pulse Energy A (J/pulse) | Laser Pulse Energy B (J/pulse) |
|---|---|---|---|
| Picosecond Pulsed Laser | | | |
| Common Range | $10^{-9}$-$10^{-12}$ | $0.5 \times 10^{-3}$-$0.5 \times 10^{-6}$ | 2-$2 \times 10^{-3}$ |
| Preferred Range | $10^{-11}$-$10^{-12}$ | $0.5 \times 10^{-5}$-$0.5 \times 10^{-6}$ | $2 \times 10^{-2}$-$2 \times 10^{-3}$ |
| Femtosecond Pulsed Laser | | | |
| Common Range | $10^{-12}$-$10^{-15}$ | $0.5 \times 10^{-6}$-$0.5 \times 10^{-9}$ | $2 \times 10^{-3}$-$2 \times 10^{-6}$ |
| Preferred Range | $10^{-13}$-$10^{-15}$ | $0.5 \times 10^{-7}$-$0.5 \times 10^{-9}$ | $2 \times 10^{-4}$-$2 \times 10^{-6}$ |

Laser Pulse Energy A: Pulse Peak Power (I) = $5 \times 10^5$ (watt) or higher
Laser Pulse Energy B: Pulse Peak Power (I) = $2 \times 10^9$ (watt) or higher The pulsed laser irradiation may be carried out by a single shot or multiple repetitive shots. The number of times of the pulsed laser irradiation is not particularly limited but is, for instance, in the range of 1 shot (single shot) to 10 million shots. When the irradiation is carried out by multiple repetitive shots, the laser repetition frequency is, for instance, in the range of 1/10000000 Hz to 1 kHz. The irradiation time also is not particularly limited but is, for instance, in the range of 1 second to 1 hour.

Specific examples of the pulsed laser include a femtosecond titanium:sapphire laser, a femtosecond fiber laser, a nanosecond/picosecond $Nd^{3+}$:YAG laser, a nanosecond/picosecond $Nd^{3+}$:$VYO_4$ laser, an excimer laser, and an alexandrite laser.

In the present invention, the solution in which a solute to be crystallized has dissolved is preferably a supersaturated solution, more preferably a solution saturated to a low degree. The supersaturation of a protein solution is, for instance, 200% to 500%, preferably 100% to 300%, and more preferably 50% to 200%. The supersaturation of an organic substance solution is, for instance, 20% to 50%, preferably 10% to 30%, and more preferably 5% to 20%. Examples of the protein to which the present invention can be applied include lysozyme, glucose isomerase, xynalase, myoglobin, catalase, trypsin, human lysozyme, photoactive yellow protein, phosphoenolpyruvate carboxylase, ribonuclease, a prostaglandin F2 alpha synthetic enzyme, adenosine deaminase, and a multidrug efflux transporter. Examples of the organic substance include 4-dimethylamino-N-methyl-4'-N-stilbazolium tosylate (DAST), methylnitroaniline (MNA), and L-arginine phosphate (LAP). As indicated in examples to be described later, the process of the present invention makes it possible to crystallize membrane protein that used to be difficult to crystallize.

FIG. 1 shows an example of the apparatus used for carrying out the process of the present invention. As shown in FIG. 1, this apparatus includes a femtosecond laser irradiation means 1, a mechanical shutter 2, a half-wave plate 3, a polarizer 4, a condenser lens 5, and a constant-temperature water bath 8. The constant-temperature water bath 8 contains water 9, and a sample container 6 is placed therein. The sample container 6 contains a solution 7 in which a solute to be crystallized has dissolved. In the constant-temperature water bath 8, the temperature is lowered gradually to decrease the solubility in the solution 7 and thereby the solution 7 is brought into a supersaturation state. In this stage, when the solution is supersaturated excessively, crystals grow quickly. The solution therefore is supersaturated to a low degree. Subsequently, when emitted from the laser irradiation means 1, a laser beam 10 passes through the mechanical shutter 2, the half-wave plate 3, the polarizer 4, and the condenser lens 5 to be focused inside the solution 7. Then an explosion phenomenon is caused at the focal point due to abrupt optical absorption to induce crystalline nucleus generation. In the case where crystals are to be grown, when they are allowed to grow slowly on crystalline nuclei over a long period of time, high-quality single crystals can be obtained. Furthermore, in the case of screening crystallization conditions, a plurality of solutions are prepared that are different slightly from each other in concentration thereof, composition ratio of the solute, or temperature condition. Subsequently, they are irradiated with a laser beam, which then are observed. When the generation of crystalline nuclei or the alteration of the solute is observed, the solution is judged to meet the crystallization conditions. Otherwise, the solution is judged not to meet the crystallization conditions. Preferably, the screening method of the present invention is used for primary screening for determining crystallization conditions.

In the present invention, it is preferable that a container including the solution in which a solute to be crystallized has dissolved be allowed to move to stir the solution and thereby a crystal generated and then grown.

In this manner, when the solution itself is not stirred directly but the container including the solution is allowed to make a movement such as, for instance, rotation, vibration, or rocking to stir the solution indirectly, gentle stirring can be carried out easily. In addition, since the convection of the solution can be controlled easily, a stirring manner that is suitable for the crystal generation can be selected. As a result, it is possible to crystallize high molecules such as protein that used to be difficult to crystallize.

The above-mentioned movement is not particularly limited. Examples thereof include rotation, vibration, and rocking, and the movement may be one in which two or more of them are combined together. The degree of the movement also is not particularly limited but is determined suitably according to, for instance, the type of the polymer solution. In the case of a circular motion, the speed is, for instance, 10 to 1000 rpm, preferably 30 to 200 rpm, and more preferably 50 to 100 rpm.

The container is not particularly limited but can be, for instance, a beaker, a laboratory dish, and a well plate including a plurality of wells.

Crystals can be generated and grown by, for instance, bringing the solution into the supersaturation state. The supersaturation state can be obtained by, for instance, evaporating the solvent contained in the solution. The evaporation is not particularly limited but can be, for example, natural evaporation, evaporation by heating, evaporation by drying under reduced pressure, as well as freezing by lyophilization. In addition, another container is prepared that contains a reservoir solution in which components other than the solute have dissolved at higher concentrations than in the solution. When this container and the container including the solution for crystallization are brought into a state where water vapor can move therebetween, evaporation of the solution for crystallization can be promoted under gentle conditions. This is preferable particularly for biopolymers such as protein that tend to be denatured. Such a method generally is called a vapor diffusion method.

In the present invention, the place where crystals grow is not particularly limited. Generally, since grown crystals have a higher specific gravity than that of the solution, they sink to move to the bottom of the container. Such a method generally is called a sitting-drop method. However, when growing in the bottom of the container, the crystals stick thereto, which may cause trouble in collecting them. Hence, it is preferable that a liquid whose specific gravity is higher than that of the solution for crystallization be put in the container and crystals be grown at the interface between the solution and the liquid with a higher specific gravity. Such a method generally is called a floating-drop method.

In the process in which the container is moved to stir the solution, the substance to be crystallized is not particularly limited. Examples thereof include resin, protein, saccharide, lipid, and nucleic acid. Preferably, this process is applied to biopolymers such as protein that are particularly difficult to crystallize. Examples of the protein include chicken egg white lysozyme, human lysozyme, glucose isomerase, xynalase, phosphoenolpyruvate carboxylase, ribonuclease, a prostaglandin F2 alpha synthetic enzyme, adenosine deaminase, and a multidrug efflux transporter.

The container of the present invention is a container that is used in the production process or the screening of the present invention. The container of the present invention is of the following three types.

A first container of the present invention is a container that is used in the process for producing a crystalline nucleus or a crystal of the present invention or a container that is used in the screening of crystallization conditions of the present invention. The container includes: a first chamber in which a solution of a substance to be crystallized is put; a second chamber in which a reservoir solution is put, in which only components other than the substance to be crystallized of the solution of the substance to be crystallized have dissolved at higher concentrations than in the solution of the substance to be crystallized; and a passage that communicates with the first chamber and the second chamber and allows gas to pass therethrough. In the container, a part or the whole of the first chamber is transparent or semitransparent so as to allow the solution of the substance to be crystallized to be irradiated with a laser beam.

With this container, evaporation of the solvent of the solution of the substance to be crystallized is promoted by the so-called vapor diffusion method and thereby the generation of crystals of the substance to be crystallized is promoted. Furthermore, with this container, the first chamber containing the solution of the substance to be crystallized is irradiated with a laser beam and thereby crystalline nuclei are generated forcibly or crystallization conditions are screened.

Furthermore, a plurality of first containers may be formed in one plate.

A second container of the present invention is a container that is used in the process for producing a crystalline nucleus or a crystal of the present invention or a container that is used in the screening of crystallization conditions of the present invention. The container includes: a first chamber in which a solution of a substance to be crystallized is put; a second chamber in which a reservoir solution is put, in which only components other than the substance to be crystallized of the solution of the substance to be crystallized have dissolved at higher concentrations than in the solution of the substance to be crystallized; and a passage that communicates with the first chamber and the second chamber and allows gas to pass therethrough. The container includes a plurality of first chambers that communicate with at least one second chamber through a plurality of passages. The plurality of passages are different in at least one of diameter and length from each other. A part or the whole of the first chamber is transparent or semitransparent so as to allow the solution of the substance to be crystallized to be irradiated with a laser beam.

With this container, evaporation of the solvent of the solution of the substance to be crystallized is promoted by the so-called vapor diffusion method and thereby the generation of crystals of the substance to be crystallized is promoted. Furthermore, with this container, since the plurality of passages are different in diameter or length or in both of them from each other, a plurality of vapor diffusion conditions can be set at a time, which allows optimal crystallization conditions to be screened or allows crystals to be generated under the optimal crystallization conditions.

A plurality of second containers may be formed in one plate.

A third container of the present invention is a container that is used in the process for producing a crystalline nucleus or a crystal of the present invention or a container that is used in the screening of crystallization conditions of the present invention. The container includes: a first chamber in which a solution of a substance to be crystallized and an immiscible hyperbaric solution are put, with the immiscible hyperbaric solution having a higher specific gravity than that of the solution of the substance to be crystallized and being immiscible with the solution of the substance to be crystallized; and a second chamber in which a reservoir solution is put, in which only components other than the substance to be crystallized of the solution of the substance to be crystallized have dissolved at higher concentrations than in the polymer solution. The first chamber is formed in the second chamber. The first chamber includes a large volume part in its lower portion and a small volume part in its upper part, with the small volume part having a smaller volume than that of the large volume part. The end of the upper part is open and gas can pass therethrough to move between the first and second chambers. The solution of the substance to be crystallized is retained in at least the upper part of the first chamber or the opening part of the end. A part or the whole of the container is transparent or semitransparent so as to allow the solution of the substance to be crystallized to be irradiated with a laser.

With this container, evaporation of the solvent of the solution of the substance to be crystallized is promoted by the so-called vapor diffusion method and thereby the generation of crystals of the substance to be crystallized is promoted at the interface between the solution of the substance to be crystallized and the immiscible hyperbaric solution. Since the solution of the substance to be crystallized is retained in the small volume part or the opening part of the end of the first chamber, a small amount of the solution of the substance to be crystallized may be used. Furthermore, when the immiscible hyperbaric solution located in the large volume part of the first chamber is stirred with, for instance, a magnet stirrer, the solution of the substance to be crystallized can be stirred indirectly and thereby crystallization further can be promoted.

With respect to the first chamber of the third container, it is preferable that the large volume part located in the lower part have a reverse truncated cone shape or a reverse truncated pyramid shape, the small volume part located in the upper part have a cylindrical shape or a rectangular-cylindrical shape, and the large volume part and the small volume part be joined to each other. When the first chamber has such a shape, a droplet of the solution of the substance to be crystallized can be formed on the opening part of the end of the small volume part located in the upper part, and in this state, the solvent of the solution of the substance to be crystallized can be evaporated. Furthermore, a plurality of third containers may be formed in one plate.

In the present invention, the substance to be crystallized is not particularly limited. Examples thereof include resin, protein, saccharide, lipid, and nucleic acid. It is preferable that the container of the present invention be used for crystallizing protein among others. Examples of the protein include chicken egg white lysozyme, human lysozyme, glucose isomerase, xynalase, phosphoenolpyruvate carboxylase, ribonuclease, a prostaglandin F2 alpha synthetic enzyme, adenosine deaminase, and a multidrug efflux transporter.

EXAMPLES

Examples of the present invention are described below together with comparative examples.

Apparatus

The apparatus shown in FIG. 1 was used in Examples 1 and 2, Comparative Example 1, and reference examples. This apparatus allows a sample solution 7 contained in a constant-temperature water bath 8 to be irradiated with an intense femtosecond titanium:sapphire laser 10 focused by a lens 5 with a focal length of 170 mm. The temperature of the constant-temperature water bath 8 can be controlled at an accuracy of ±0.05° C. The laser 10 has a wavelength of 800 nm and a duration of 120 fs. The repetition frequency of laser oscillation can be adjusted from 1 kHz to 1 Hz. When the sample solution 7 is to be irradiated with a single-shot laser pulse, the repetition frequency is adjusted to 20 Hz and the single-shot pulse is taken out of the pulse train by opening a mechanical shutter 2 for only 50 ms. The laser pulse energy can be adjusted with a half-wave plate 3 and a polarizer 4. This apparatus allows the sample solution 7 to be irradiated with a laser pulse whose pulse energy is 250 µJ/pulse ($2 \times 10^9$ watt).

Example 1

After 3.5 g of DAST (4-dimetylamino-N-metyl-4'-N-stilbazolium tosylate) were put into a Teflon® container 6 with a volume of 200 ml together with 200 ml of methanol and a rotor, this was placed in a constant-temperature water bath 8 whose initial temperature was 27.0° C. Thereafter, the temperature was increased to 55.0° C. over two hours and thereby the DAST was dissolved while the solution was stirred with a stirrer. After it was ensured that the DAST had dissolved about 5 hours later, the solution 7 was divided into three, which were used as growth solutions. In this stage, the rotor was removed. When 16 hours passed after the preparation of the solutions, the solutions were heated at 55° C. for ten hours and then the temperature was lowered to 23° C. at a rate of 3° C./hour. Further, the temperature was lowered to 21.4° C. at a rate of 0.1° C./hour. In this state, the solutions were irradiated with a femtosecond laser whose pulse energy was 250 µJ/pulse ($2 \times 10^9$ watt) at a repetition frequency of 1 kHz for two minutes. Thereafter, no crystal deposition was observed for one hour. Then crystal deposition was observed visually ten hours later. The observation was continued for about six days, with the above-mentioned temperature being maintained. As a result, the crystal that was found first had grown and additionally a few crystals were observed. Then laser irradiation was carried out again at a pulse energy of 250 µJ/pulse ($2 \times 10^9$ watt) and a repetition frequency of 1 kHz for one minute. No crystal deposition was observed for three days after the irradiation.

Example 2

Chicken egg white lysozyme was used as an object from which a crystalline nucleus is to be generated. A solution thereof was prepared as follows. That is, 0.467 g of sodium acetate trihydrate was added to 50 ml of distilled water, acetic acid was added thereto so as to adjust it to pH4.5, and then 1.25 g of sodium chloride and 1.25 g of chicken egg white lysozyme were added thereto. The sample solution 7 adjusted to room temperature was put into a 100-ml Teflon container 6. This was kept in a constant-temperature water bath 8 at 40° C. for 24 hours and thereby complete dissolution was achieved. Thereafter, it was cooled to 25° C. over five hours and then impurities were removed therefrom with a membrane filter. Then 2 ml of the solution thus obtained and 3 ml of florinate were put into each of ten glass bottles 6 with a diameter of 18 mm that each were provided with a screw cap. These glass bottles 6 were allowed to stand still in the constant-temperature water bath 8 whose temperature was kept at 25° C. The temperature of the solution was lowered to 15° C. over 20 hours. The saturation point of the sample solution (the lysozyme solution) 7 is 23.8° C. Then the solution was checked and no crystal deposition was observed. Thereafter, the temperature of the solution was lowered to 14° C. over 24 hours. The solution was maintained at 14° C. for 24 hours. It then was checked again and thereby no crystal deposition was observed. Thereafter, the solutions 7 contained in the ten glass bottles were irradiated one by one with a femtosecond pulsed laser whose pulse energy was 250 µJ/pulse ($2 \times 10^9$ watt) for one minute and thereby changes caused therein were observed. With respect to the irradiation conditions, the repetition frequency of the laser was varied to 50 Hz and 100 Hz, at each of which two each out of the ten glass bottles were irradiated. Four of the ten glass bottles were not irradiated with the laser to be used as controls. It was observed visually one day after the laser irradiation that crystals had deposited in the solutions irradiated at 50 Hz and 100 Hz. No crystal deposition was found in the solutions that had not been irradiated with the laser. Furthermore, the solutions in which no crystal deposition had been found were irradiated with a laser at 500 Hz and 1000 Hz. As a result, it was observed that lysozyme had aggregated (denatured) in the solutions. Accordingly, these solutions were judged to have the possibility of crystallization.

Comparative Example 1

The generation of crystalline nuclei was attempted using a protein solution whose conditions were the same as those employed in Example 2, by irradiating the protein solution with a YAG laser (with a wavelength of 1064 nm, 5 ns). The protein solution was prepared as follows. That is, 0.467 g of sodium acetate trihydrate was added to 50 ml of distilled water, acetic acid was added thereto so as to adjust it to pH4.5, and then 1.25 g of sodium chloride and 1.25 g of chicken egg white lysozyme were added thereto. The sample solution 7 adjusted to room temperature was put into a 100-ml Teflon container. This was kept in a constant-temperature water bath at 40° C. for 24 hours and thereby complete dissolution was achieved. Thereafter, it was cooled to 25° C. over five hours and then impurities were removed therefrom with a membrane filter. Then 2 ml of the solution thus obtained and 3 ml of fluorinate were put into each of ten glass bottles with a diameter of 18 mm that each was provided with a screw cap. These glass bottles were allowed to stand still in a constant-temperature water bath whose temperature was kept at 25° C. The temperature of the solution was lowered to 15° C. over 20 hours. The saturation point of the sample solution (the lysozyme solution) is 23.8° C. Then the solution was checked and thereby no crystal deposition was observed. Thereafter, the temperature of the solution was lowered to 14° C. over 24 hours. The solution was maintained at 14° C. for 24 hours. It then was checked again and thereby no crystal deposition was observed. Thereafter, the solutions contained in the ten glass bottles were irradiated one by one with the YAG laser for one minute and thereby changes caused therein were observed. With respect to the irradiation conditions, the repetition frequency of the laser was varied to 10 Hz, 20 Hz, 50 Hz, 100 Hz, 500 Hz, and 1000 Hz at which six out of the ten glass bottles were irradiated, respectively. Four of the ten glass bottles were not irradiated with the laser to be used as controls. The laser pulse energy was 1.2 mJ/pulse. No crystal deposition was observed one day after the laser irradiation. In order to increase the supersaturation degree, the temperature of the solutions was lowered to 16° C. over 10 hours and then the solutions were maintained for 12 hours. After they were checked and thereby no crystal deposition was observed, laser irradiation was carried out again. The irradiation conditions were the same as those described above. No crystal deposition was observed again this time. Similarly, in the states where the temperature was adjusted to 15° C. and 14° C., laser irradiation was carried out. However, neither crystal deposition nor denaturation was observed after all. The laser average power employed in this example was ten times higher than that of the femtosecond pulsed laser used in the examples but the pulse peak power (photon flux) was $2.5 \times 10^5$ (watt), which was $\frac{1}{10000}$ of that employed in the examples. Presumably, this resulted in no generation of crystalline nuclei.

Reference Example 1

Figure 2:
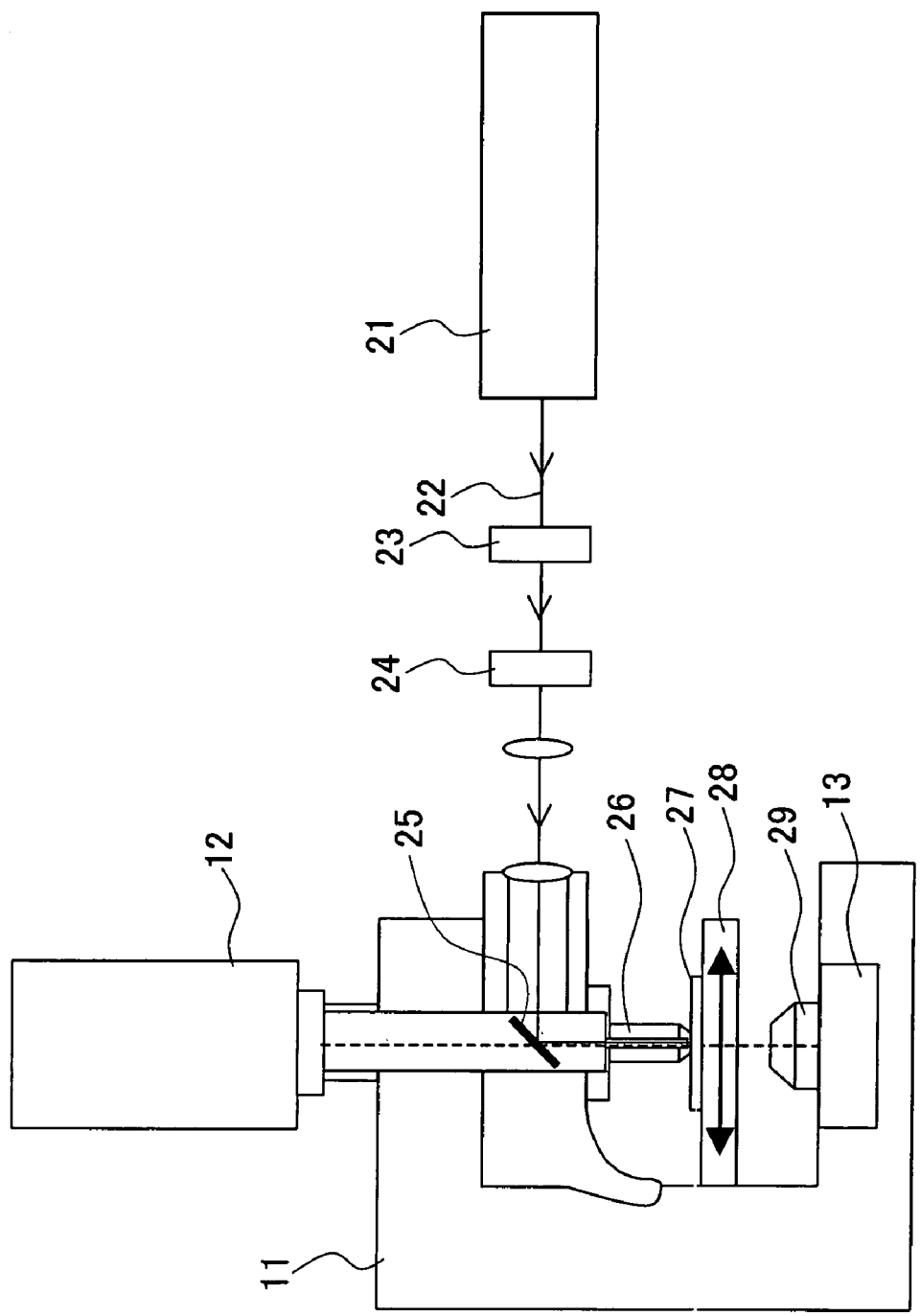
FIG. 2 is a diagram showing the configuration of an example of the apparatus for measuring the magnitude of impulse waves that are generated by laser irradiation.

Impulse waves that would be caused by the explosion phenomenon produced by a pulsed laser were examined using the apparatus shown in FIG. 2. This apparatus includes an erect microscope and a pulsed laser irradiation apparatus added thereto. As shown in FIG. 2, the erect microscope 11 includes a stage 28 on which an object to be observed is placed, a condenser lens 29, and an objective lens (with a magnification of 100 times and a numerical aperture of 1.25) 26. A microchip 27 is placed on the stage 28. A light source lamp 13 is disposed under the condenser lens 29 located in the lower part of the erect microscope 11. A CCD camera 12 that detects the light of the light source lamp 13 is disposed in the upper portion of the microscope 11. Furthermore, the pulsed laser irradiation apparatus 21 is disposed outside the erect microscope 11. A laser 22 passes through a half-wave plate 23 and a polarizer 24 to reach the inside of the erect microscope 11 that is irradiated therewith. The path of the laser is bent at a right angle by a dichroic mirror 25 and then the inside of the microchip 7 placed on the stage 28 is irradiated with the laser. The pulsed laser used herein is an intense femtosecond titanium:sapphire laser (800 nm, 120 fs) employing chirp amplification. In addition, a dispersion liquid of polystyrene minute particles (with a diameter of 1 µm) is contained in the microchip 27. In this apparatus, when the laser 22 is emitted, it is focused on the dispersion liquid of polystyrene minute particles contained in the microchip 27 placed on the stage 28. Thereby the state of the inside of the microchip 27 is observed with the CCD camera 12.

Figure 3:
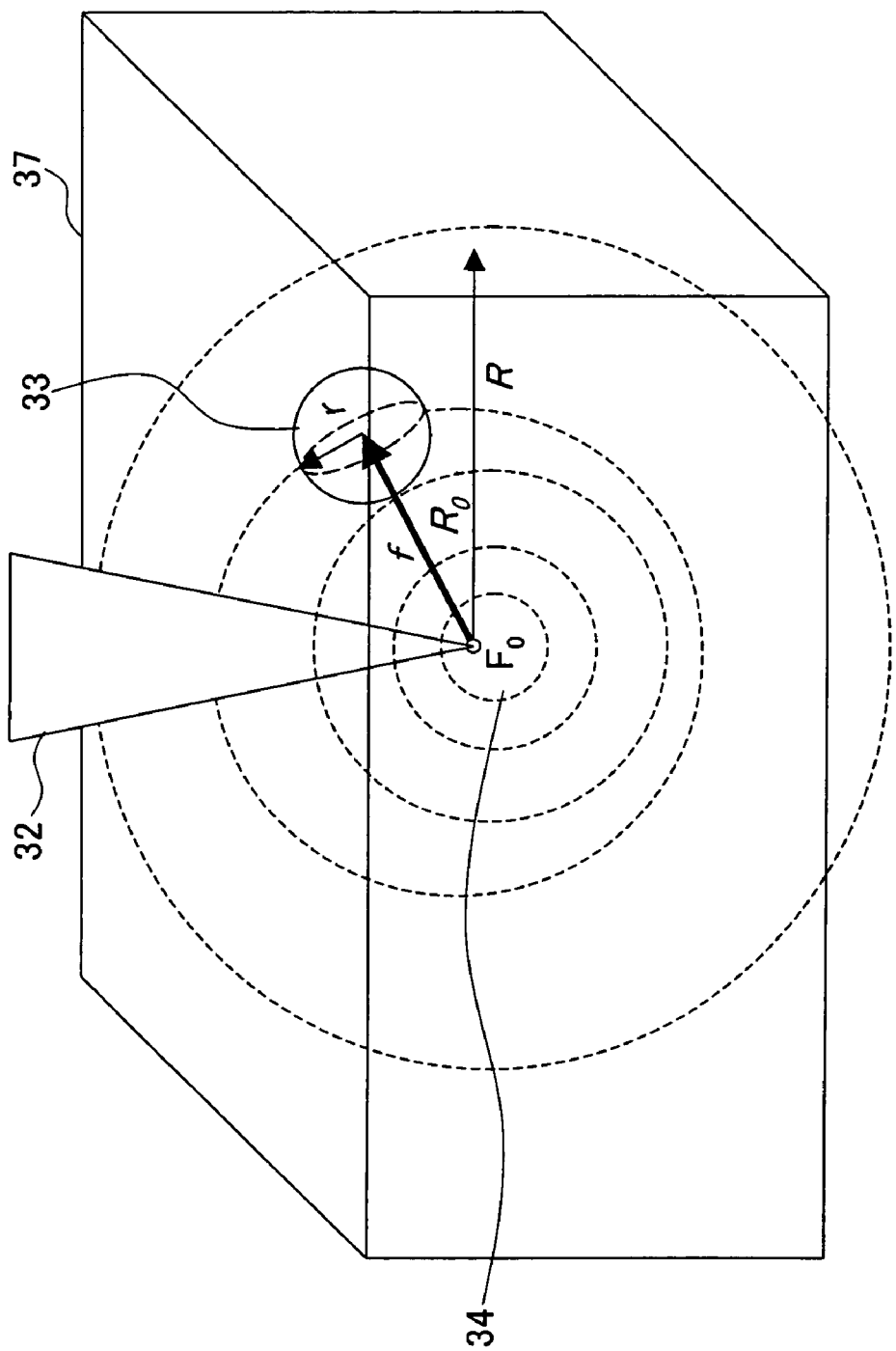
FIG. 3 is a schematic view showing an example of the relationship between impulse waves that are generated by a pulsed laser and a motion of a particle.
Figure 4:
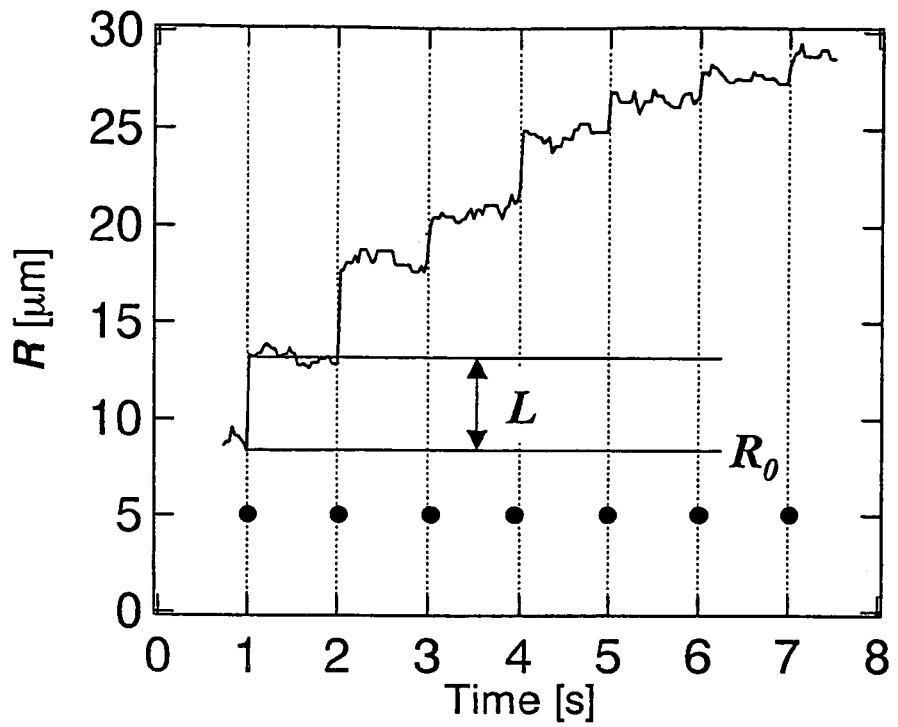
FIG. 4 is a graph showing the relationship between a laser focal point and a distance for which a particle is moved by the impulse waves measured with the above-mentioned apparatus.

The effect of impulse waves on the polystyrene minute particles was examined using this apparatus. That is, the dispersion liquid of polystyrene minute particles was irradiated with a single-shot beam of the femtosecond titanium:sapphire laser under the aforementioned conditions. The impulse waves that are presumed to be generated at the focal point of the laser propagate three-dimensionally. The minute particles thereby are pushed away from the focal point of the laser. The motions of the polystyrene minute particles caused by the impulse waves were observed with the CCD camera. The distance for which the polystyrene minute particles moved away from the focal point was checked and thereby the magnitude of the impulse waves was estimated. FIG. 3 is a schematic view showing the relationship between the force imposed on a polystyrene minute particle and impulse waves generated through pulsed laser irradiation. In FIG. 3, "f" indicates the force of impulse waves imposed on the minute particle, "$F_0$" the force generated by the impulse waves, "$R_0$" the initial position of the minute particle, "R" the position of the minute particle measured from the center of the impulse waves, "r" the radius of the minute particle, numeral 32 a laser beam, numeral 33 the polystyrene minute particle, numeral 34 the focal point of the laser, and numeral 37 a dispersion liquid of polystyrene minute particles. FIG. 4 is a graph showing the relationship between the pulsed laser irradiation and the distance for which the minute particle was moved by the impulse waves generated by the irradiation. In FIG. 4, the horizontal axis indicates time, the vertical axis indicates the position (R) of the minute particle measured from the center of the impulse waves, "$R_0$" denotes the initial position of the minute particle, "L" denotes the distance for which the minute particle moved, and black dots each indicate pulsed laser irradiation time. As shown in this graph, it can be understood that the minute particle instantaneously moves away from the focal point upon the pulsed laser irradiation. When it is assumed that the impulse waves propagate isotropically in three dimensions due to impulse response and the minute particle stops due to the viscous resistance of water, the following formulae hold. Accordingly, it is possible to estimate the force ($F_0$) that is generated by the impulse waves from the relationship between the initial position ($R_0$) of the minute particle and the distance (L) for which the minute particle moved.

Force of Impulse Wave imposed on Minute Particle:

$$f = F_0 \frac{\pi r^2}{4\pi R_0^2} \delta(t)$$

Equation of Motion of Minute Particle:

$$m\frac{d^2 R}{dt^2} = -6\pi\eta r \frac{dR}{dt} + f$$

Magnitude of Displacement of Minute Particle:

$$L = R(t=\infty) - R_0 \Leftrightarrow L = \frac{F_0 \cdot r}{24 p\eta} \cdot \frac{1}{R_0^2}$$

Figure 5:
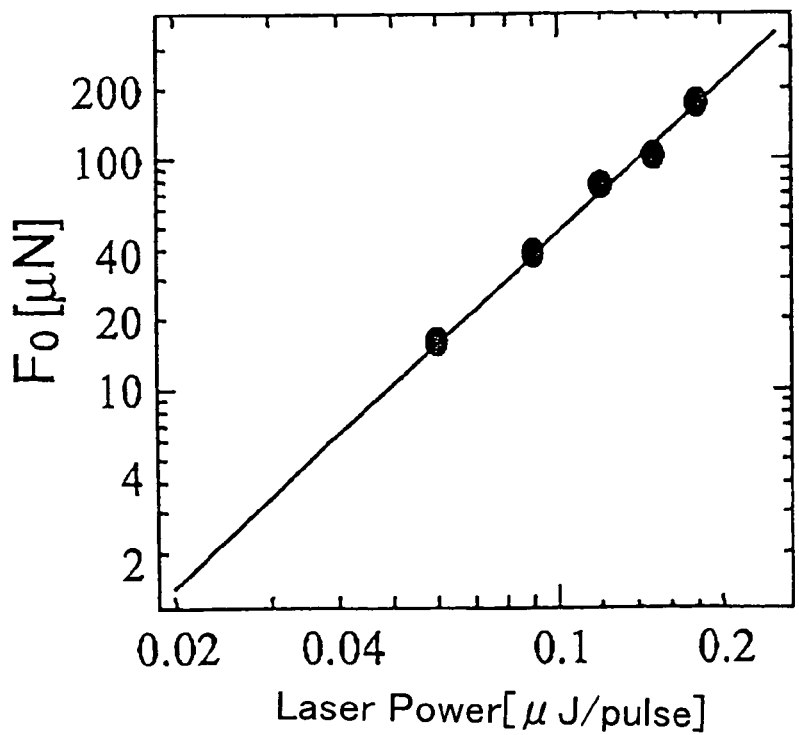
FIG. 5 is a graph showing the relationship between laser pulse energy and the strength of the impulse waves measured with the above-mentioned apparatus.

In such a manner, motions of hundreds of minute particles were observed and thereby the relationship between the pulse energy of the femtosecond titanium:sapphire laser and the force generated by impulse waves was determined. The result is shown in graph in FIG. 5. In this graph, the vertical axis indicates the force ($F_0$) of impulse waves while the horizontal axis indicates the laser pulse energy ($I_0$). As shown in FIG. 5, impulse waves were observed at 60 nJ/pulse or higher in this reference example. The threshold of the explosion phenomenon depends on the probability of multiphoton absorption. Accordingly, the threshold is defined by not the laser pulse energy that is defined as the total laser energy but the pulse peak power (I) of a beam that reaches instantaneously. In this reference example, since the laser pulse energy (W) of the pulsed laser with a duration ($\Delta t$) of 120 fs was 60 nJ/pulse, the pulse peak power (I) of the laser beam is calculated as follows:

$$I = W/\Delta t = 5 \times 10^5 (\text{J/s·pulse=watt}).$$

Hence, the duration ($\Delta t$) is expressed as $\Delta t < W/5 \times 10^5$ in this reference example. With consideration given to this formula and the performance of the laser irradiation apparatus, the pulsed laser preferably has a duration of nanoseconds or shorter, more preferably picoseconds or shorter, and most suitably femtoseconds or shorter. The present invention, however, is not interpreted limitedly by this reference example. In this reference example, it is assumed that the explosion phenomenon occurs at the focal point of the laser and thereby impulse waves are generated. The present invention, however, is not limited thereto.

In this reference example, polystyrene minute particles were used to visualize impulse waves. However, the polystyrene minute particles each has a weight of $1.1 \times 10^{-12}$ g, which is at least 100 million times of the weight of protein. That is, there is a possibility that protein may be changed in its density even by impulse waves that are far weaker as compared to the polystyrene minute particles. The laser pulse energy and the pulse peak power of the pulsed laser defined through the visualization of the polystyrene minute particles do not limit the lower limits thereof in the present invention.

Example 3

This example is an example of crystallization of chicken egg white lysozyme (14 kDa). A protein solution was prepared at room temperature under the following conditions. That is, it included 25 mg/ml of lysozyme, 2.5% of sodium chloride, and 0.1 M of sodium acetate, and it had a pH value of 4.5. Impurities were removed from this solution using a membrane filter.

Figure 6:
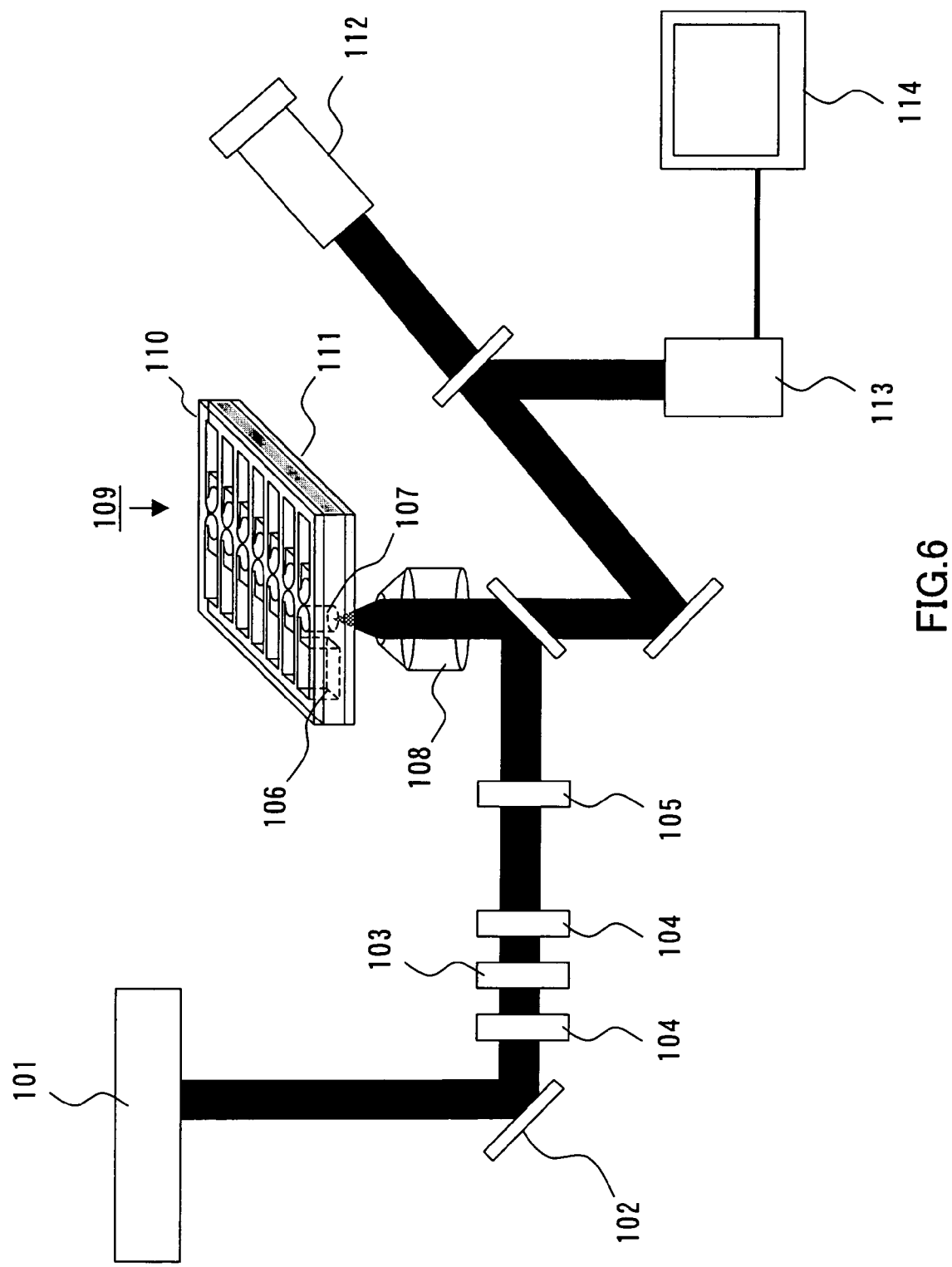
FIG. 6 is a diagram showing the configuration of a laser irradiation apparatus used in another example of the present invention.

The crystallization was carried out by a batch method using a laser irradiation apparatus and a crystallization plate shown in FIG. 6. As shown in FIG. 6, in this laser irradiation apparatus, a laser emitted from a femtosecond laser irradiation apparatus 101 passes through a mirror 102, a wavelength plate 103, polarizers 104, and a shutter 105 and then is focused with an objective lens (with a magnification of 10 times) 108. A crystal growth vessel part 107 of the crystallization plate 109 then is irradiated therewith. The crystallization plate 109 allows the vapor diffusion method to be utilized and includes crystal growth vessel parts 107 in which the protein solution is put and server solution parts 106 that communicate with the crystal growth vessel parts 107, respectively. The server solution is a solution in which the same components as those of the protein solution other than protein have dissolved. This promotes evaporation of the protein solution. In FIG. 6, numeral 110 indicates a sealing tape while numeral 111 denotes a transparent glass. The crystal growth vessel parts 107 can be observed visually with an ocular lens 112 or can be observed using a CCD 113 camera and a monitor 114.

The laser irradiation was carried out in a clean room (with a temperature of 23° C.±2° C. and a humidity of 65%±5%) whose temperature and humidity were controlled. The wavelength of the laser was 780 nm, the duration thereof was 200 femtoseconds (fs), and the repetition frequency of laser oscillation was 1 kHz. The laser pulse energy was adjusted with the wavelength plate and the polarizers. The number of times of the laser beam irradiation was adjusted by changing the period of time for which the shutter was opened and closed.

After 10 μl of protein solution were put into each crystal growth vessel part 107 of the crystallization plate 110, the solution was irradiated with a focused laser beam at room temperature. The laser pulse energy was 1.95 nJ/pulse. The number of pulses was varied to 8 pulses (1/125 second), 62 pulses (1/16 second), 24000 pulses (24 seconds), and zero pulse, i.e. no irradiation, (zero second) by adjusting the period of time for which the shutter was opened.

Figure 8:
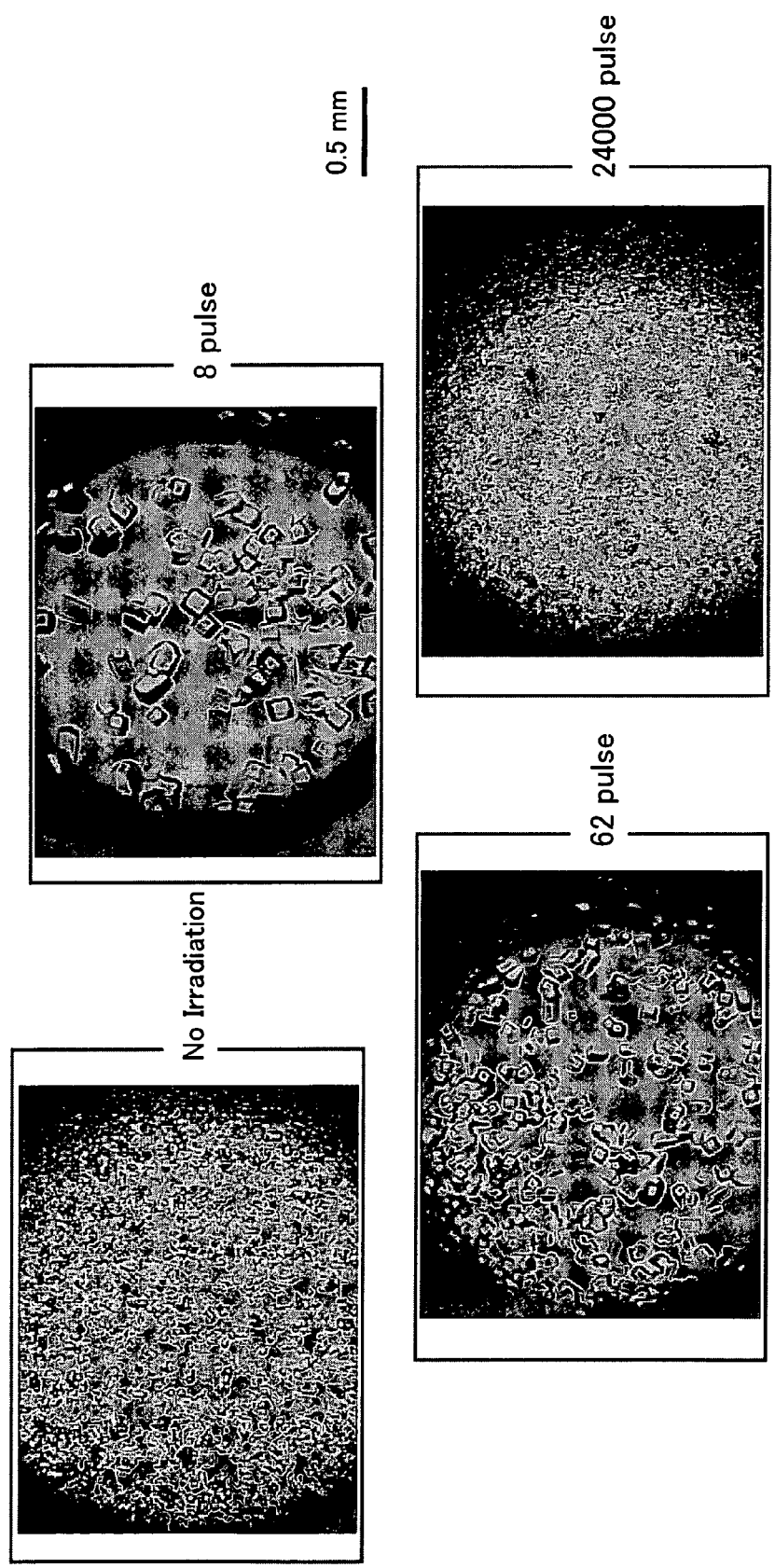
FIG. 8 shows micrographs of protein crystals produced in an example of the present invention.

After the laser irradiation, it was allowed to stand still in a constant temperature bath whose temperature had been set at 18° C. and the crystal growth thereafter was observed. FIG. 8 shows micrographs taken two days after the laser irradiation. The number of crystals that deposited increased with the increase in the number of times of laser irradiation. Furthermore, in the sample that was not subjected to the laser irradiation, a large number of small crystals deposited. This is because the solution had been highly supersaturated and thereby crystalline nuclei were generated spontaneously all over the solution, which resulted in the generation of a large number of nuclei that was caused at a time. This often is observed in usual crystal growth and is a barrier to the improvement in quality and the increase in size of crystals. On the other hand, in the samples that had been irradiated with the laser, crystalline nuclei were generated in a solution supersaturated to a low degree that had a room temperature, and the nuclei then served as seed crystals and grew. Hence, the increase in the number of pulses resulted in the increase in the number of crystalline nuclei to be generated and in turn, the number of deposited crystals increased.

Thus, it is conceivable that the generation of crystalline nuclei is a phenomenon depending on the number of times of laser pulse irradiation. The increase in the number of crystals that is caused by the increase in the number of times of irradiation means the increase in probability of crystal generation that is caused by the increase in the number of times of irradiation. Furthermore, the phenomenon (an incubation effect) generally has been known that the laser pulse energy to be required for causing the explosion phenomenon by a laser decreases with the increase in the number of times of irradiation (for instance, S. Preuss et al. (Appl. Phys. Lett. 62(23), 7 Jun. 1993, p 3049-3051)). In other words, it is conceivable that the increase in the number of times of irradiation results in decreases in laser pulse energy and pulse peak power of laser pulses to be required for crystal generation. In this example, the laser pulse energy provided by multiple shots of laser irradiation is much lower than the lower limit of the laser pulse energy defined by the motion of a polystyrene minute particle. Conceivably, this is because of the size of the protein molecule that is far smaller than the polystyrene minute particle and the effect of the multiple shots of pulsed laser irradiation. These, however, are mere surmises of the present inventors and therefore do not limit the scope of the present invention.

Example 4

This example is an example of crystallization of ribonuclease H (17 kDa). A protein solution was prepared by dissolving 5 mg/ml of ribonuclease H in 0.05 M of Tris hydrochloric acid buffer solution (pH 9.0) at room temperature. Thereafter, impurities were removed therefrom with a membrane filter. In addition, 0.2 M of Tris hydrochloric acid with a pH value of 9.0 was prepared as a server liquid (an external liquid). The crystallization to be implemented by laser irradiation was carried out by the sitting-drop vapor diffusion method using the laser irradiation apparatus and the crystallization plate shown in FIG. 6.

That is, 10 μl of protein solution were put into each crystal growth vessel part 107 while 100 μl of external liquid were poured into each server solution part 106. Then the protein solution was irradiated with a focused laser beam at room temperature. The laser irradiation was carried out in a clean room (with a temperature of 23° C.±2° C. and a humidity of 65%±5%) whose temperature and humidity were controlled. The wavelength of the laser was 780 nm, the duration thereof was 200 femtoseconds (fs), and the repetition frequency of laser oscillation was 1 kHz. The laser pulse energy was adjusted with the wavelength plate and the polarizers. The number of times of the laser beam irradiation was adjusted by changing the period of time for which the shutter was opened and closed. The laser pulse energy was 1.95 nJ/pulse. The number of pulses was varied to 8 pulses (1/125 second), 62 pulses (1/16 second), 4000 pulses (4 seconds), 8000 pulses (8 seconds), and zero pulse, i.e. no irradiation (zero second), by adjusting the period of time for which the shutter was opened.

Figure 9:
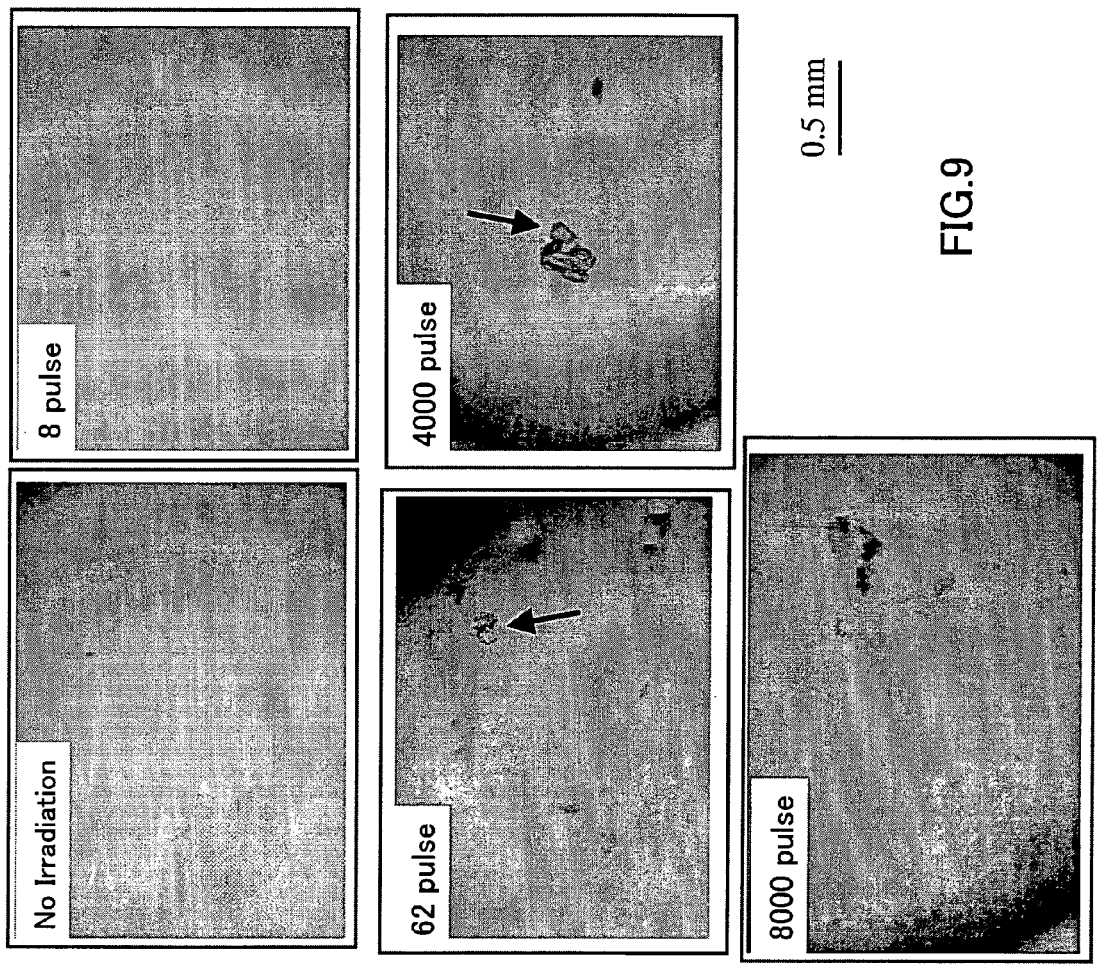
FIG. 9 shows micrographs of protein crystals produced in another example of the present invention.

After the laser irradiation, it was allowed to stand still in a constant temperature bath whose temperature had been set at 14° C. and the crystal growth thereafter was observed. FIG. 9 shows micrographs taken one day after the laser irradiation. In the sample that was not subjected to the laser irradiation, crystal deposition was not observed even after two weeks elapsed. However, the differences in deposition state were observed that were caused depending on the laser irradiation conditions. No crystalline nuclei were generated in the solution that was irradiated at 8 pulses while crystal deposition was observed in the solutions that were irradiated at 62 pulses and 4000 pulses. Furthermore, denatured ribonuclease H was found in the solution that had been irradiated at 8000 pulses.

Example 5

This example is an example of crystallization of glucose isomerase (173 kDa). A protein solution was prepared by dissolving 20 mg/ml of glucose isomerase in 0.2 M of ammonium sulfate solution (pH 7.0) at room temperature. Thereafter, impurities were removed therefrom with a membrane filter. In addition, a solution (pH 7.0) in which 0.2 M of ammonium sulfate and 15% of polyethylene glycol (PEG) 6000 were dissolved was prepared as a server liquid (an external liquid). The crystallization to be implemented by laser irradiation was carried out by the sitting-drop vapor diffusion method using the laser irradiation apparatus and the crystallization plate shown in FIG. 6.

That is, 10 μl of protein solution were put into each crystal growth vessel part 107 while 100 μl of external liquid were poured into each server solution part 106. Thereafter, 5 μl of external liquid were pipetted from the server solution part 106 and then were poured into the crystal growth vessel part 107. Then the protein solution and the server solution were mixed together well, which then was irradiated with a focused laser beam at room temperature. The laser irradiation was carried out in a clean room (with a temperature of 23° C.±2° C. and a humidity of 65%±5%) whose temperature and humidity were controlled. The wavelength of the laser was 780 nm, the duration thereof was 200 femtoseconds (fs), and the repetition frequency of laser oscillation was 1 kHz. The laser pulse energy was adjusted with the wavelength plate and the polarizers. The number of times of the laser beam irradiation was adjusted by changing the period of time for which the shutter was opened and closed. The laser pulse energy was 1.95 nJ/pulse. The number of pulses was varied to 8 pulses (1/125 second), 4000 pulses (4 seconds), and zero pulse, i.e. no irradiation (zero second) by adjusting the period of time for which the shutter was opened.

Figure 10:
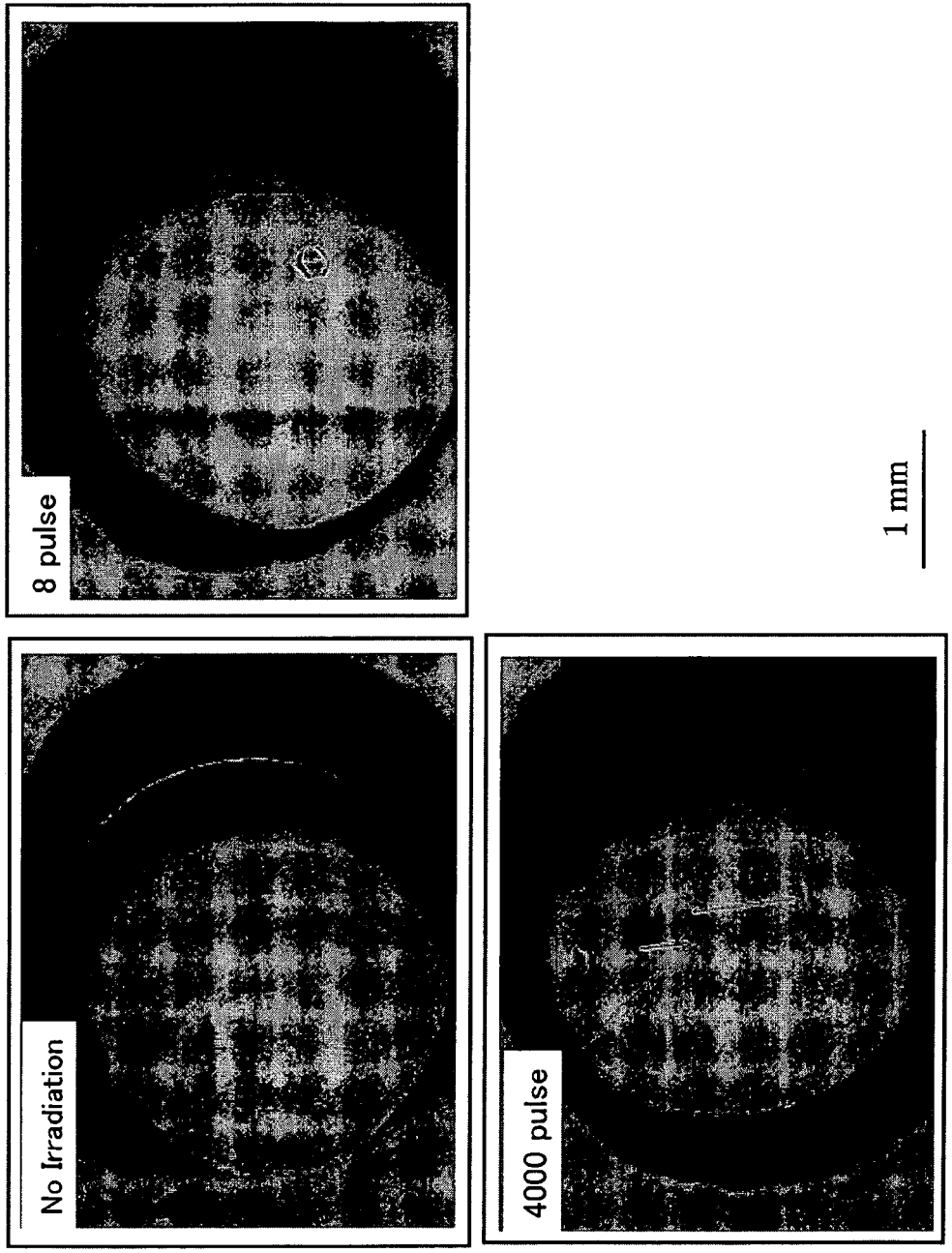
FIG. 10 shows micrographs of protein crystals produced in still another example of the present invention.

After the laser irradiation, it was allowed to stand still in a constant temperature bath whose temperature had been set at 18° C. and the crystal growth thereafter was observed. FIG. 10 shows micrographs taken one day after the laser irradiation. In the solutions that were irradiated with the laser, crystal deposition was observed. In the sample that was not subjected to the laser irradiation, however, crystal deposition was not observed even after one month elapsed. In this example, glucose isomerase that was a huge protein with a molecular weight of about 200000 was crystallized. Hence, the process of the present invention using laser irradiation also is effective for crystallization of such a huge protein.

Example 6

This example is an example of crystallization of a Trypanosoma-derived prostaglandin F2 alpha synthetic enzyme (31 kDa). A protein solution was prepared by dissolving 20 mg/ml of the above-mentioned synthetic enzyme and 0.005 M of nicotinamide adenine dinucleotide phosphate (NADP+) well in 0.04 M of Tris hydrochloric acid buffer solution (pH 8.0) at room temperature. Thereafter, impurities were removed therefrom with a membrane filter. In addition, a solution (pH 7.5) containing 0.01 M of Hepes sodium hydroxide buffer solution (HEPES-NaOH), 2% of polyethylene glycol (PEG) 400, and 1.2 M of ammonium sulfate was prepared as a server liquid (an external liquid).

Figure 7:
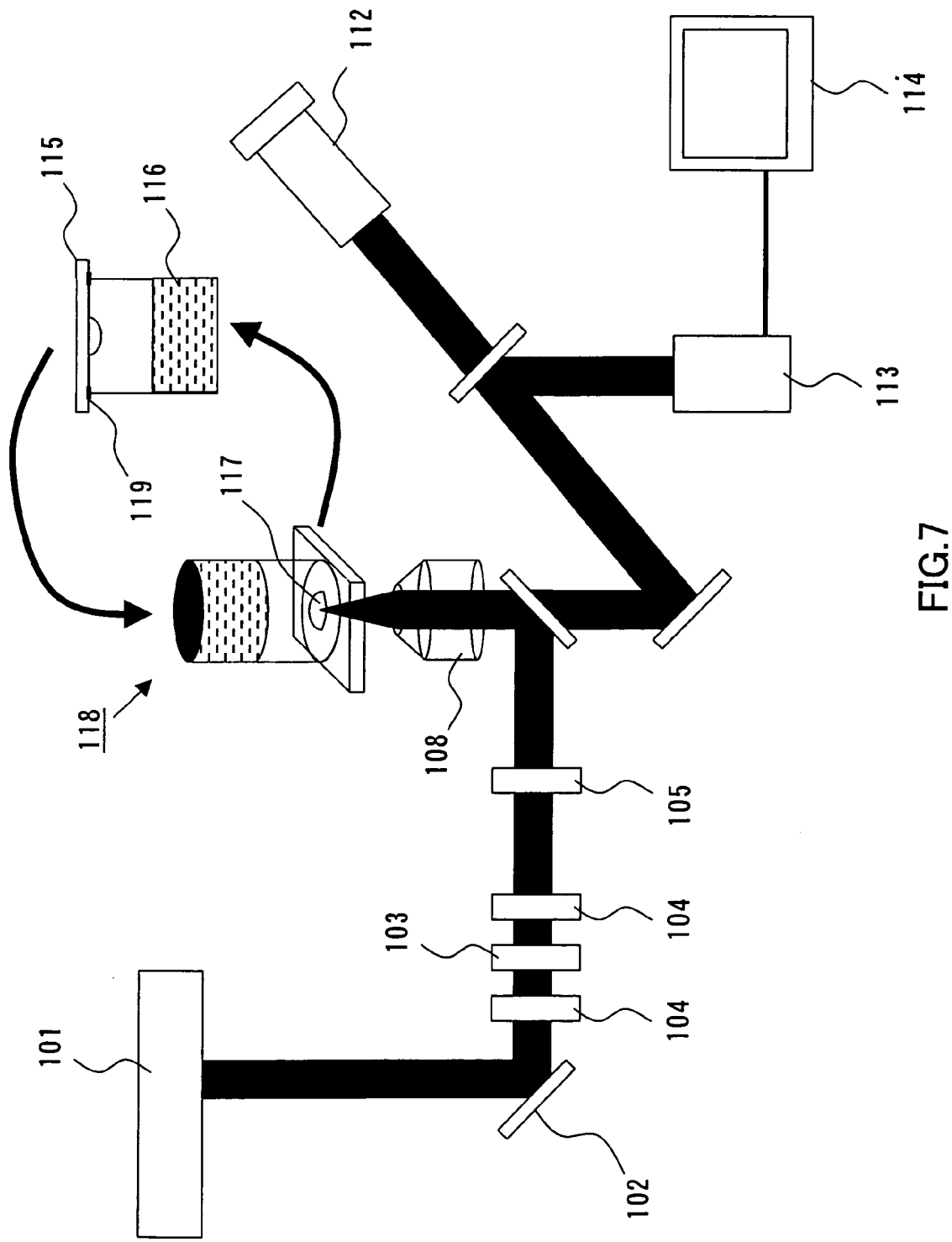
FIG. 7 is a diagram showing the configuration of a laser irradiation apparatus used in still another example of the present invention.

The crystallization to be implemented by laser irradiation was carried out by the hanging-drop vapor diffusion method using the laser irradiation apparatus and the crystallization container shown in FIG. 7. As shown in FIG. 7, in this laser irradiation apparatus, a laser emitted from the femtosecond laser irradiation apparatus 101 passes through a mirror 102, a wavelength plate 103, polarizers 104, and a shutter 105 and then is focused with an objective lens (with a magnification of 10 times) 108. A crystal solution 117 contained in a crystallization container 118 then is irradiated therewith. The crystal solution 117 can be observed visually with an ocular lens 112 or can be observed using a CCD 113 camera and a monitor 114. In FIG. 7, numeral 116 denotes an external liquid, numeral 115 indicates a glass plate, and numeral 119 denotes grease.

As shown in FIG. 7, a droplet of the crystallization solution containing 2 μl of protein solution and 2 μl of external liquid that had been mixed together was formed on the glass plate 115. Thereafter, 500 μl of external liquid 116 were put into the crystallization container 118 and the crystallization container 118 was covered with the glass plate, with the droplet 117 of the crystallization solution hanging from the glass. In this case, the grease 119 was used for sealing the crystallization container 118. The crystallization container 118 then was turned upside down while caution was taken to prevent the external liquid 116 from dropping. Subsequently, the droplet 117 of the crystallization solution was irradiated with a focused laser beam. The laser irradiation was carried out in a clean room (with a temperature of 23° C.±2° C. and a humidity of 65%±5%) whose temperature and humidity were controlled. The wavelength of the laser was 780 nm, the duration thereof was 200 femtoseconds (fs), and the repetition frequency of laser oscillation was 1 kHz. The laser pulse energy was adjusted with the wavelength plate and the polarizers. The number of times of the laser beam irradiation was adjusted by changing the period of time for which the shutter was opened and closed. The laser pulse energy was 1.95 nJ/pulse. The irradiation was carried out at 62 pulses (1/16 second) by adjusting the period of time for which the shutter was opened. A sample that had not been subjected to the laser irradiation was grown as a control experiment.

After the laser irradiation, it was allowed to stand still in a constant temperature bath whose temperature had been set at 20° C. and the crystal growth thereafter was observed. FIG. 11 shows micrographs taken seven days after the laser irradiation. In the solution that had been irradiated with the laser, crystal deposition was observed. In the sample that had not been subjected to the laser irradiation, however, crystal deposition was not observed even after three months elapsed. In this example, the laser irradiation allowed crystals to be produced in a short period of time.

Example 7

This example is an example of crystallization of adenosine deaminase (ADA) native. A protein solution was prepared by dissolving 20 mg/ml of ADA native in 0.0025 M of Hepes buffer solution (pH 7.5) at room temperature. Thereafter, impurities were removed therefrom with a membrane filter. In addition, the following two solutions were prepared as server solutions (external liquids): (1) a solution (pH 6.5) containing 0.2 M of sodium citrate, 0.1 M of sodium cacodylate, and 30% of isopropanol; and (2) a solution (pH 5.6) containing 0.2 M of ammonium acetate, 0.1 M of sodium citrate, and 30% of polyethylene glycol (PEG) 4000.

The crystallization to be implemented by laser irradiation was carried out by the sitting-drop vapor diffusion method using the laser irradiation apparatus and the crystallization plate shown in FIG. 6. First, 2 μl of protein solution were put into each crystal growth vessel part 107 while 100 μl of each of the external liquids (1) and (2) were poured into each server solution part 106. Thereafter, 2 μl of external liquids were pipetted from the server solution part 106 and then were poured into the crystal growth vessel part 107. The protein solution and the external liquids were mixed together well, which then was irradiated with a focused laser beam at room temperature. The laser pulse energy was 1.95 nJ/pulse. The irradiation was carried out at 1000 pulses (1 second) by adjusting the period of time for which the shutter was opened. A sample that had not been subjected to the laser irradiation was grown as a control experiment.

Figure 12:
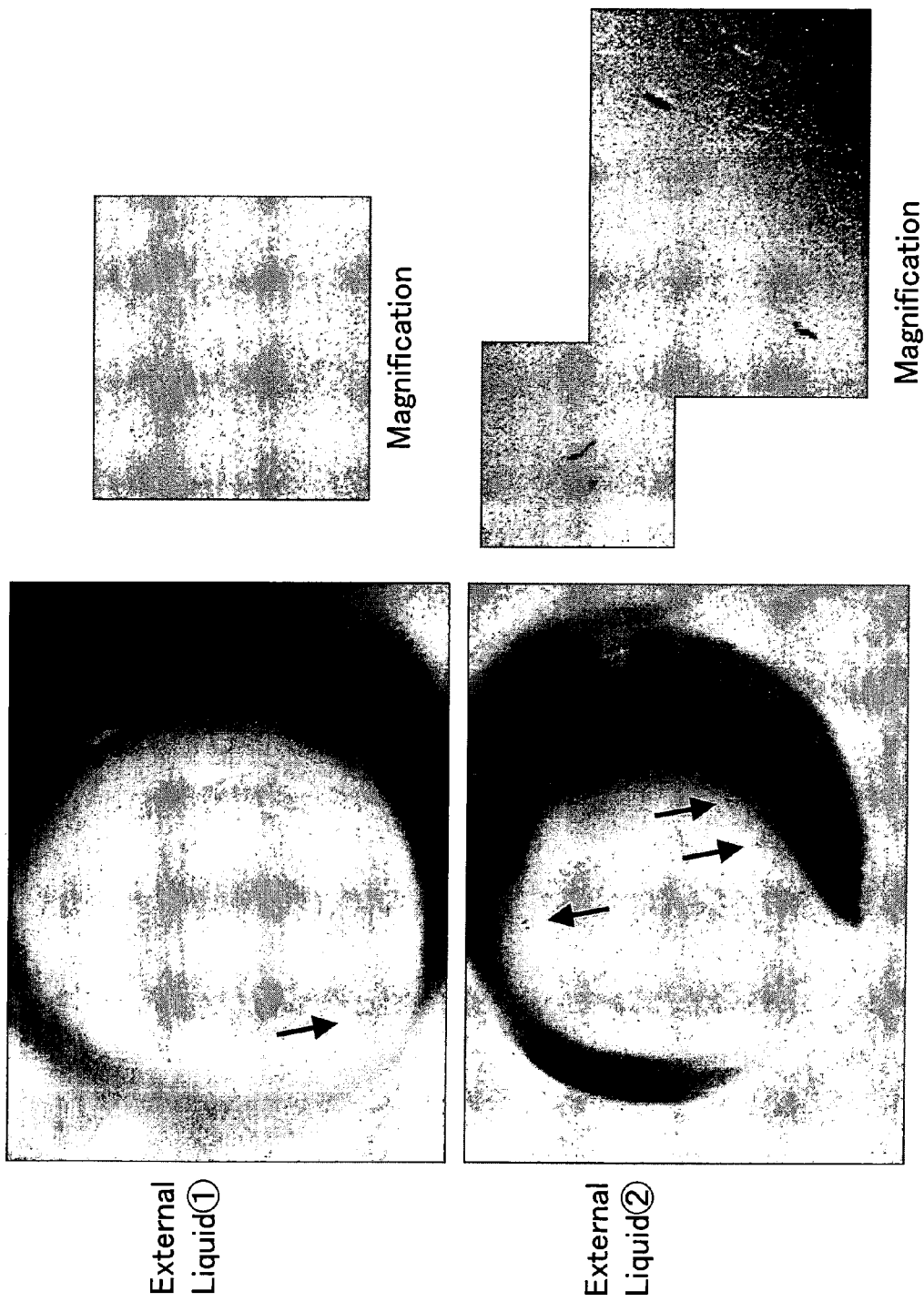
FIG. 12 shows micrographs of protein crystals produced in a further example of the present invention.

After the laser irradiation, it was allowed to stand still in a constant temperature bath whose temperature had been set at 20° C. and the crystal growth thereafter was observed. FIG. 12 shows micrographs taken seven days after the laser irradiation. In the solution that had been irradiated with the laser, crystal deposition was observed. In the sample that had not been subjected to the laser irradiation, however, crystal deposition was not observed even after one month elapsed. Crystals of the present protein had never been obtained before, but the present example made it possible to crystallize the protein for the first time.

Example 8

This example is an example of crystallization of multidrug efflux transporter (AcrB) contained in *Escherichia coli*. The AcrB is a polytopic-type membrane protein, more specifically a trimer protein in which three monomers composed of 1049 amino acid residues are entangled.

A protein solution was prepared by adding 0.02 M of sodium phosphate (pH 6.2), 10% of glycerol, and 0.2% of dodecyl maltoside to 28 mg/ml of AcrB labeled with histidine. A server liquid (an external liquid) was prepared by blending 14.1% to 14.6% of polyethylene glycol (PEG) 4000, 0.08 M of sodium phosphate (pH 6.2), and 0.02 M of sodium citrate-hydrochloric acid (pH 5.6).

The crystallization to be implemented by laser irradiation was carried out by the sitting-drop vapor diffusion method using the crystallization container and the apparatus shown in FIG. 6.

That is, 2 µl of protein solution were put into each crystal growth vessel part 107 while 50 µl of external liquid described above were poured into each server solution part 106. Thereafter, 2 µl of external liquid were pipetted from the server solution part 106 and then were poured into the crystal growth vessel part 107. Thus the protein solution and the external liquid were mixed together well. In this example, six growth solutions were prepared that have concentrations of PEG 4000 varying from 14.1% to 14.6% in increments of 0.1%, respectively. Crystallization was carried out using the respective growth solutions. Thereafter, each protein solution was irradiated with an intense femtosecond titanium:sapphire laser that was focused with an objective lens (with a magnification of 10 times). The irradiation was carried out in a clean room (with a temperature of 23° C.±2° C. and a humidity of 65%±5%) whose temperature and humidity were controlled. The wavelength of the laser was 780 nm, the duration thereof was 200 femtoseconds (fs), and the repetition frequency of laser oscillation was 1 kHz. The laser pulse energy was 800 nJ/pulse. The irradiation was carried out at 250 pulses (¼ second) by adjusting the period of time for which the shutter was opened. A sample that had not been subjected to the laser irradiation was grown as a control experiment.

Figure 13:
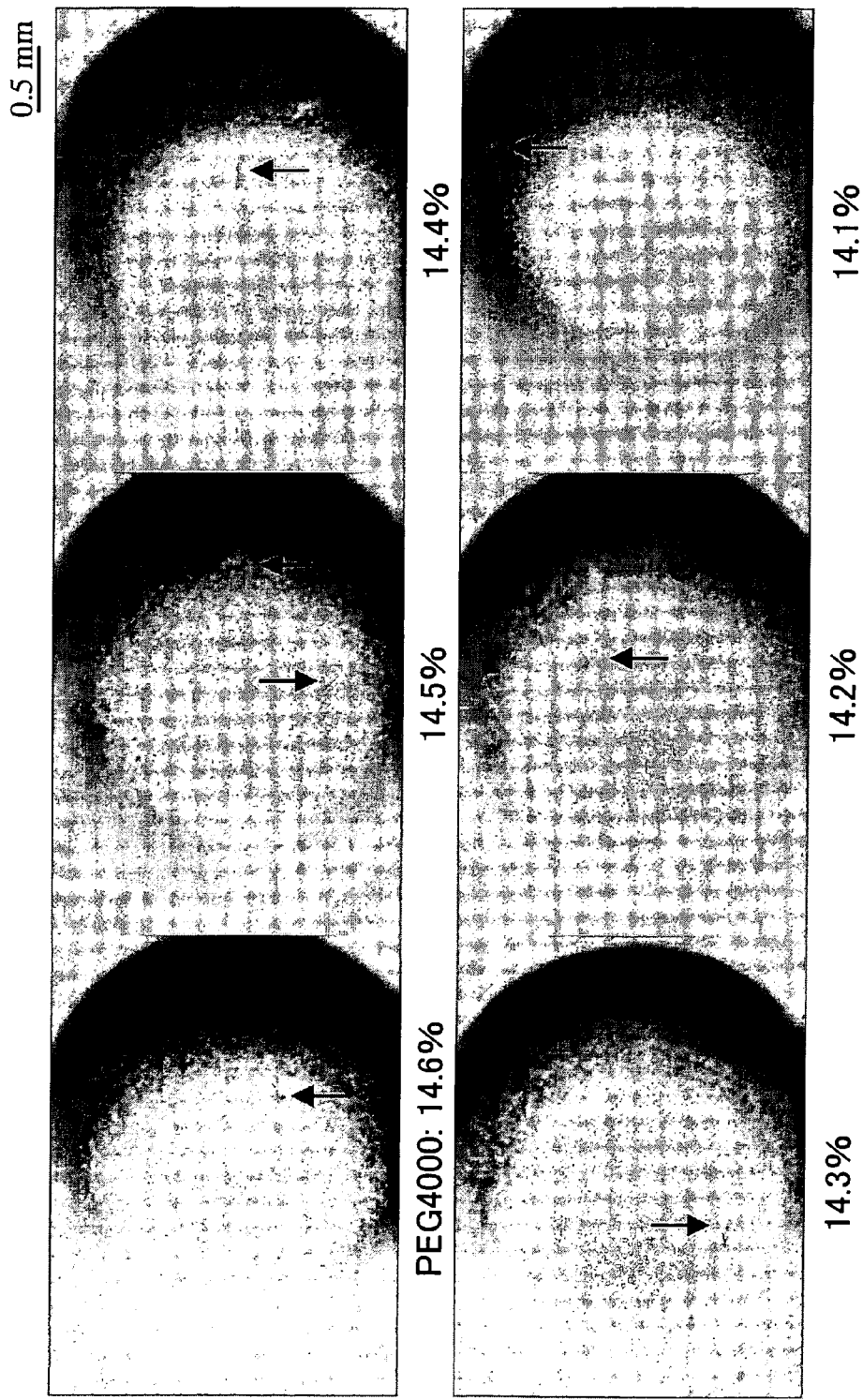
FIG. 13 shows micrographs of protein crystals produced in still another example of the present invention.

After the laser irradiation, they were allowed to stand still in a constant temperature bath whose temperature had been set at 25° C. and the crystal growth thereafter was observed. FIG. 13 shows micrographs taken two days after the laser irradiation. As shown in FIG. 13, in all the growth solutions that had been irradiated with the laser, crystal deposition was observed (indicated with arrows in FIG. 13) although the crystal growth solutions were prepared with concentrations of polyethylene glycol (PEG) 4000 varying from each other. On the other hand, in the sample that had not been subjected to the laser irradiation, crystal deposition was not observed even when one week elapsed (not shown in FIG. 13).

Membrane protein is difficult to crystallize, but crystallization of membrane protein was achieved in this example.

Reference Example 2

This reference example is an example of crystallization of protein that was carried out by moving a container.

A solution was stirred in growing crystals of hen egg white lysozyme. A protein solution used herein was prepared as follows. That is, acetic acid was added to 50 ml of distilled water and 0.467 g of sodium acetate trihydrate so that the solution was adjusted to pH 4.5, and then 1.25 g of sodium chloride and 1.25 g of hen egg white lysozyme were added thereto. The solution thus prepared at room temperature was put into a 100-ml Teflon container and then was maintained in a constant-temperature water bath at 40° C. for 24 hours. Thereby complete dissolution was achieved. Thereafter, it was cooled to 25° C. over five hours and then impurities were removed therefrom with a membrane filter having holes with a diameter of 0.2 µm. On the other hand, a reservoir solution used herein was prepared as follows. That is, acetic acid was added to 50 ml of distilled water and 0.467 g of sodium acetate trihydrate so that the solution was adjusted to pH 4.5, and then 3 g of sodium chloride were added thereto.

Using 300 µl of reservoir solution with respect to 3 µl and 10 µl of protein solutions, the difference caused depending on whether the solution was stirred was examined. The crystallization method used herein was the sitting-drop vapor diffusion method. In addition, the experiment also was carried out by the floating-drop vapor diffusion method in which fluorinate (a solution with a higher specific gravity than that of the protein solution) was used and crystals were grown at the interface between the two liquids. The amount of fluorinate solution was 10 µl. The crystal growth was carried out at a constant temperature, 20° C.

Figure 14:
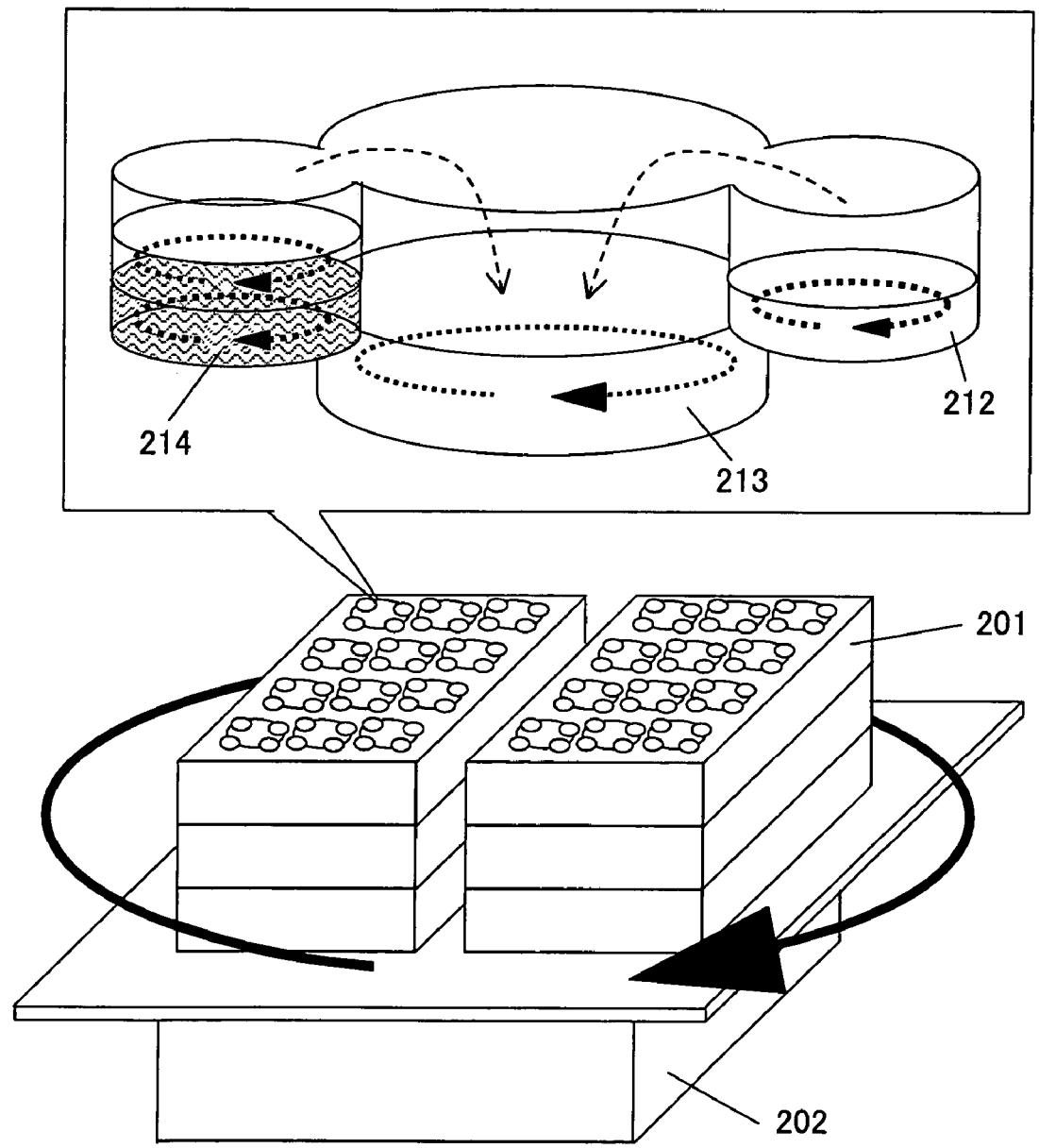
FIG. 14 is a schematic view showing a stirring apparatus used in Reference Example 2.

A rotary shaker (BR-15, manufactured by TIETECH CO., LTD) was used as a stirring mechanism. The rotational speed was set at 50 rpm at which the solution was stirred gently. FIG. 14 shows a schematic view of this stirring apparatus. As shown in FIG. 14, well plates 201 were placed on a shaker 202 and subjected to rotary motion. Thus the solution was stirred. Each well of the well plates 201 is composed of two small wells and one large well. The small wells that are subjected to the floating-drop method contain the protein solutand fluorinate 214 while those that are subjected to the sitting-drop method contain the protein solution 212. On the other hand, a large well contains a reservoir solution 213 including components other than lysozyme that have dissolved at high concentrations. This method allows a large amount of solution to be stirred easily at a time.

FIG. 15 shows the results of crystal growth. Clear differences in the number of deposited crystals and crystal size were caused depending on whether the solution was stirred. As shown in FIGS. 15A and 15B, in the conventional method in which the solution was not stirred, a number of very small crystals (microcrystals) were deposited. On the other hand, as shown in FIGS. 15C and 15D, when the solution was stirred during crystal growth, a smaller number of crystals deposited and larger crystals were obtained. Furthermore, as compared to the solution-stirring sitting-drop method (see FIG. 15C), the solution-stirring floating-drop method (FIG. 15D) allowed a smaller number of crystals to deposit and crystals to have larger sizes.

Next, examples of the container according to the present invention are described with reference to the drawings.

Example 9

Figure 16:
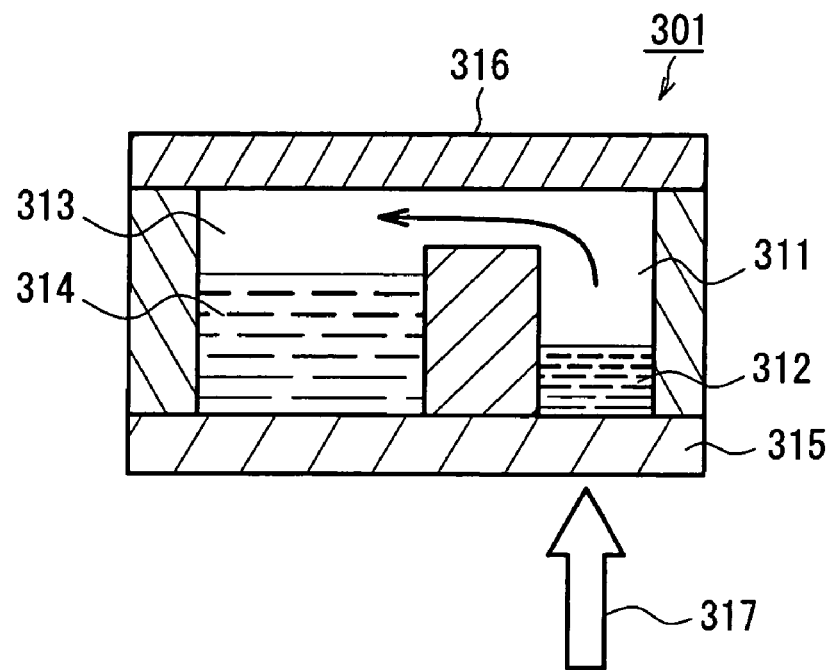
FIG. 16 is a cross sectional view showing an example of the container of the present invention.

An example of the first container according to the present invention is shown in the cross sectional view in FIG. 16. As shown in FIG. 16, this container 301 includes a first chamber 311 and a second chamber 313 that communicate with each other through a passage. The top of this container 301 is covered with a lid 316 and thereby the container 301 is in the sealed state. The portion of the bottom part 315 of the container 301 that corresponds to the first chamber is transparent or semitransparent so that a laser beam 317 can pass therethrough. The material of the portion of the bottom is not particularly limited as long as it transmits a laser beam. Examples of the material to be used herein include transparent members such as silica glass, glass, transparent resin such as, for example, acrylic resin. The material of the parts other than the portion of the bottom is not particularly limited but, for instance, common resins, glass, etc. can be used. The size of the whole container is not particularly limited but is, for instance, L 20 to 180 mm×W 10 to 120×H 3 to 50 mm, preferably L 40 to 150 mm×W 20 to 100×H 5 to 30 mm, and more preferably L 50 to 130 mm×W 30 to 80×H 10 to 20 mm. A solution 312 such as, for instance, a protein solution is put in the first chamber 311 while a reservoir solution 314 is put in the second chamber 313. Accordingly, it is preferable that the first chamber 311 be smaller than the second chamber 313. This container 301 may be used as follows, for example.

First, after the lid 316 is removed, a polymer solution 312 such as, for instance, a protein solution is put into the first chamber 311 while a reservoir solution 314 is put into the second chamber 313. The container then is covered with the lid 316 to be sealed. Then, as indicated with an arrow in FIG. 16, water vapor generated from the polymer solution 312 moves to the second chamber 313 through the passage. This promotes evaporation of the solvent of the polymer solution 312. When the polymer solution 312 is brought into a supersaturation state, the polymer solution 312 is irradiated with, for instance, a pulsed laser beam 317 from the side of the bottom of the container 301 in order to generate crystalline nuclei forcibly. If crystalline nuclei have been generated, crystals then are allowed to grow thereafter. On the other hand, if no crystalline nuclei have been generated, the conditions employed thereby are judged to be unsuitable for crystallization and then crystallization is attempted under other conditions.

As described above, when pulsed laser irradiation is carried out and observations are made to judge whether crystalline nuclei have been generated, if crystalline nuclei have been generated, the conditions of the solution, etc. can be judged to be suitable for crystallization. When crystal growth then is carried out thereafter, crystals can be obtained. Furthermore, pulsed laser irradiation is carried out and the state of the solute then is observed. If the solute has altered, the conditions of the solution, etc. can be judged to be suitable for crystallization. In the case of protein, the alteration of the solute can be an alteration (denaturation) in three dimensional structure, for instance.

With respect to the container of the present invention, the type of laser, irradiation conditions, etc. are the same as those indicated in, for instance, the description of the production process according to the present invention. These laser conditions, etc also are common to other containers or plates of the present invention.

Example 10

Figure 17:
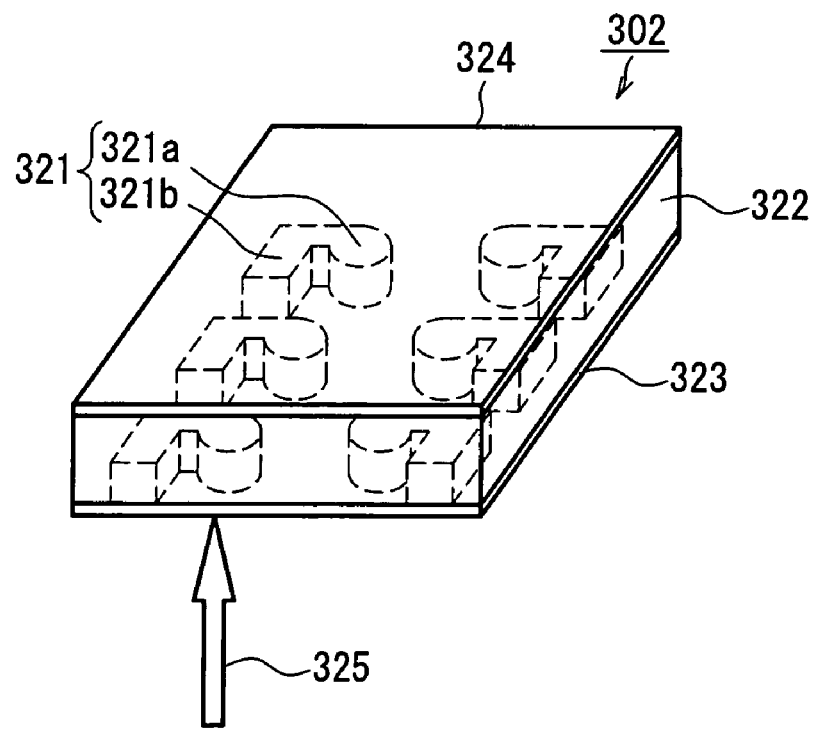
FIG. 17 is a perspective view showing an example of the plate of the present invention.

Next, an example in which a plurality of the above-mentioned first containers are formed in one plate is shown in the perspective view in FIG. 17.

As shown in FIG. 17, this plate 302 includes six first containers 321 formed therein. Each of the first containers 321 includes a first chamber 321a and a second chamber 321b that communicate with each other through a passage. This plate 302 is composed of a plate body 322 in which the first containers 321 are formed, a bottom part 323, and a lid 324. The bottom part 323 is formed of a transparent or semitransparent member so as to allow irradiation of a laser beam 325 to be carried out. The materials, of which the plate 302 is formed, the size of the containers 321, etc. are the same as in the first container described above. The size of this plate 302 is not particularly limited but is, for instance, L 20 to 180 mm×W 10 to 120×H 3 to 50 mm, preferably L 40 to 150 mm×W 20 to 100×H 5 to 40 mm, and more preferably L 50 to 130 mm×W 30 to 80×H 10 to 30 mm. The number of containers 321 is six in this plate 302, but the present invention is not limited thereto. It may be 1 to 1536, preferably 2 to 384, and more preferably 4 to 96 per plate. This plate 302 is used as follows, for example.

That is, first, a polymer solution and a reservoir solution are put into the first chamber 321a and the second chamber 321b of the container 321, respectively, and thereby vapor diffusion occurs to promote evaporation of the solvent of the polymer solution. After the polymer solution is brought into a supersaturation state, the irradiation of the pulsed laser 325 is carried out as described before and thereby crystalline nuclei are generated forcibly. When crystalline nuclei have been generated, they are allowed to grow and thereby intended polymer crystals can be obtained. On the other hand, when no crystalline nuclei have been generated, the crystallization conditions used thereby are judged to be inappropriate, and crystallization is attempted under the next conditions. This plate includes a plurality of containers formed therein. Hence, crystallization conditions that are different from each other in, for instance, concentration of the polymer solution can be set in the respective containers. Furthermore, the respective containers can be irradiated with a laser under different conditions.

Example 11

Figure 18A:
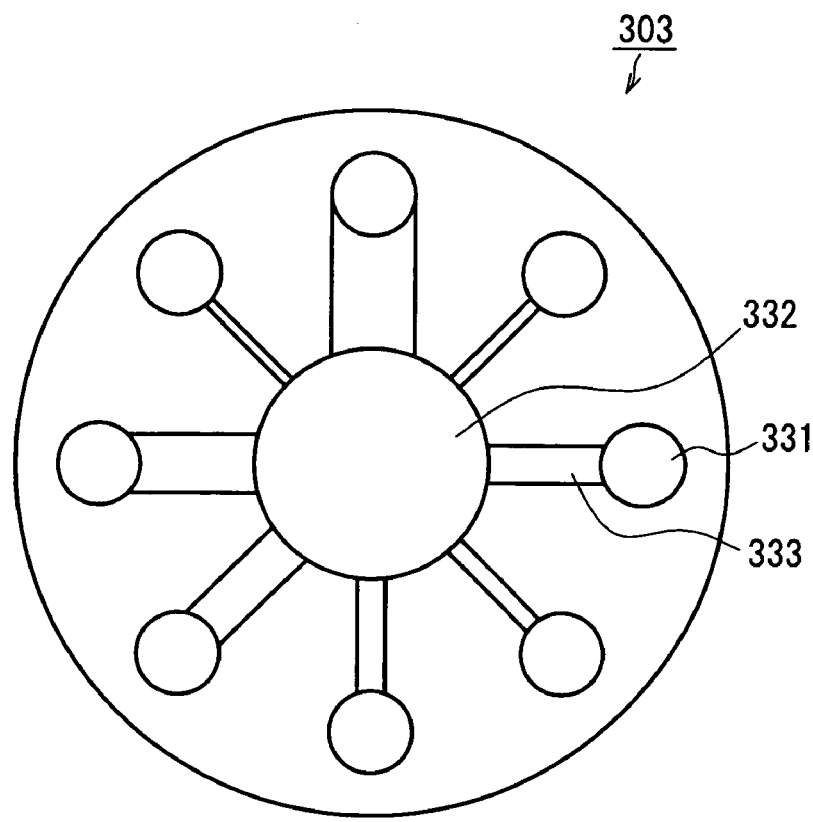
FIGS. 18A and 18B are a plan view and a cross sectional view showing another example of the container according to the present invention, respectively.
Figure 18B:
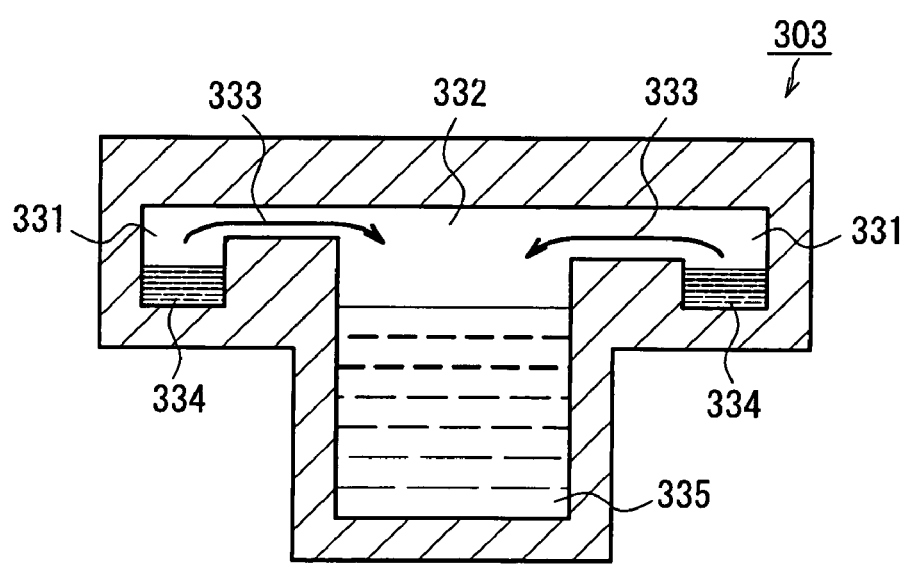

An example of the second container according to the present invention is shown in FIG. 18. In FIG. 18, FIG. 18A is a plan view while FIG. 18B is a cross sectional view.

As shown in FIGS. 18A and 18B, a container 303 has a shape in which a cylinder is joined to the bottom of a disk. In the peripheral portion of the disk, eight first chambers 331 are formed radially from the circle center. The cylinder has one second chamber 332 formed therein. The first chambers 331 communicate with the second chamber 332, with passages 333 extending from the respective first chambers 331 to the second chamber 332. The eight passages 333 are different in diameter from each other. The size of the whole container 303 is not particularly limited. It is determined suitably according to the size and the number of the first chambers, the size of the second chamber, etc. With respect to the size of the first chambers, each of them has, for instance, an inner diameter of 0.5 to 10 mm and a depth of 1 to 50 mm, preferably an inner diameter of 1 to 5 mm and a depth of 3 to 40 mm, and more preferably an inner diameter of 1 to 3 mm and a depth of 3 to 30 mm. The number of the first chambers is, for instance, 1 to 1536, preferably 2 to 384, and more preferably 4 to 96. With respect to the size of the second chamber, it has, for instance, an inner diameter of 1 to 30 mm and a depth of 1 to 50 mm, preferably an inner diameter of 2 to 20 mm and a depth of 2 to 40 mm, and more preferably an inner diameter of 3 to 15 mm and a depth of 3 to 30 mm. The length of the passages also is not limited but is, for instance, 0.5 to 50 mm, preferably 1 to 30 mm, and more preferably 1 to 20 mm. These passages are different in diameter from each other.

The diameter is, for instance, 0.3 to 10 mm, preferably 0.5 to 5 mm, and more preferably 0.5 to 3 mm. Furthermore, the material of the container 303 also is not particularly limited but it may be formed of resin or glass, for example. However, when the first chamber is to be irradiated with a laser, it is advantageous that the portion through which laser irradiation is to be carried out is formed of the transparent or semitransparent member described before so as to transmit the laser. This container 303 is used as follows, for example.

That is, first, a polymer solution 334 and a reservoir solution 335 are put into the plurality of first chambers 331 and the second chamber 332, respectively. As indicated with arrows in FIG. 18B, water vapor generated from the polymer solution 334 then passes through the passages 333 to move to the second chamber 332. This vapor diffusion promotes evaporation of the solvent of the polymer solution 334. Since the passages 333 are different in diameter from each other, the vapor diffusion conditions are different in the respective first chambers 333. Accordingly, when crystalline nuclei have been generated in a plurality of first chambers, they are allowed to grow thereafter and thereby intended polymer crystals can be obtained. On the other hand, with respect to first chambers in which no crystalline nuclei have been generated, the crystallization conditions employed therein can be judged to be unsuitable. Furthermore, after the polymer solution 334 is brought into a supersaturation state, crystalline nuclei may be generated forcibly by pulsed laser irradiation as described before. When crystalline nuclei have been generated, they are allowed to grow and thereby intended polymer crystals can be obtained. On the other hand, when no crystalline nuclei have been generated, the crystallization conditions used thereby are judged to be inappropriate, and crystallization is attempted under the next conditions.

Example 12

Figure 19A:
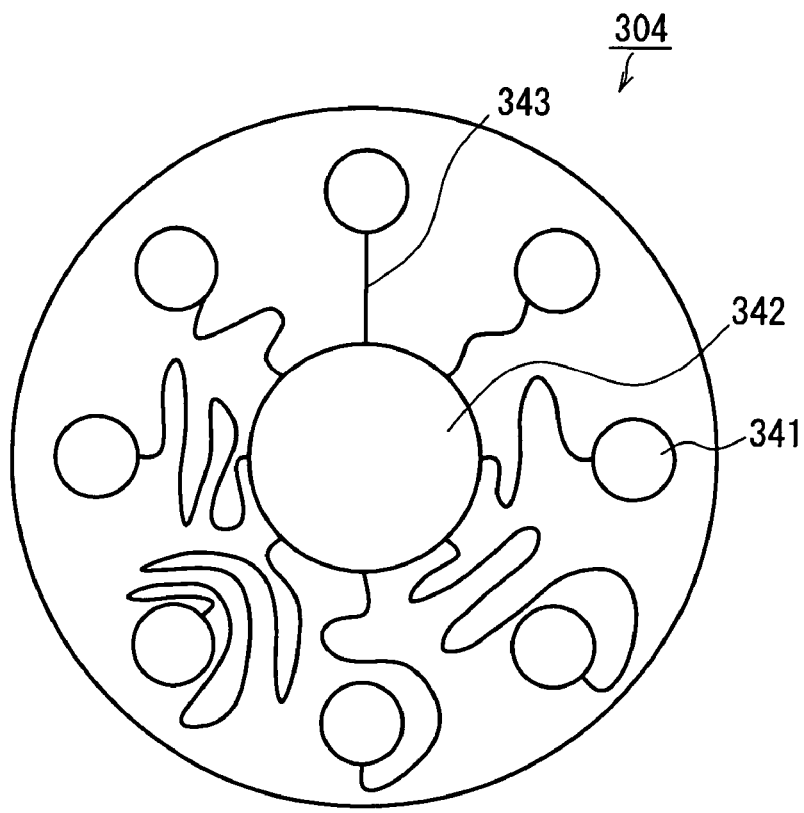
FIGS. 19A and 19B are a plan view and a cross sectional view showing still another example of the container according to the present invention, respectively.
Figure 19B:
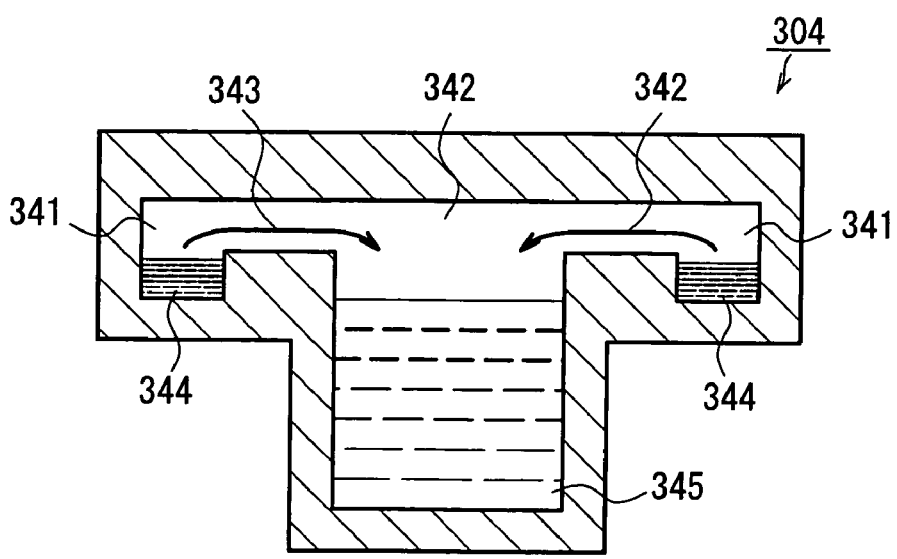

Next, another example of the second container according to the present invention is shown in FIG. 19. In FIG. 19, FIG. 19A is a plan view while FIG. 19B is a cross sectional view.

As shown in FIGS. 19A and 19B, the container 304 has a shape in which a cylinder is joined to the bottom of a disk. In the peripheral portion of the disk, eight first chambers 341 are formed radially from the circle center. The cylinder has one second chamber 342 formed therein. The first chambers 341 communicate with the second chamber 342, with passages 343 extending from the respective first chambers 341 to the second chamber 342. The eight passages 343 are different in length from each other. The size of the whole container 304 is not particularly limited. It is determined suitably according to the size and the number of the first chambers, the size of the second chamber, etc. With respect to the size of the first chambers, each of them has, for instance, an inner diameter of 0.5 to 10 mm and a depth of 1 to 50 mm, preferably an inner diameter of 1 to 5 mm and a depth of 3 to 40 mm, and more preferably an inner diameter of 1 to 3 mm and a depth of 3 to 30 mm. The number of the first chambers is, for instance, 1 to 1536, preferably 2 to 384, and more preferably 4 to 96. With respect to the size of the second chamber, it has, for instance, an inner diameter of 1 to 30 mm and a depth of 1 to 50 mm, preferably an inner diameter of 2 to 20 mm and a depth of 2 to 40 mm, and more preferably an inner diameter of 3 to 15 mm and a depth of 3 to 30 mm. The length of the passages also is not limited but is, for instance, 0.5 to 50 mm, preferably 1 to 30 mm, and more preferably 1 to 20 mm.

These passages are different in diameter from each other. The diameter is, for instance, 0.3 to 10 mm, preferably 0.5 to 5 mm, and more preferably 0.5 to 3 mm. Furthermore, the material of the container 4 also is not particularly limited but it may be formed of resin or glass, for example. However, when the first chamber is to be irradiated with a laser, it is advantageous that the portion through which laser irradiation is to be carried out is formed of the transparent or semitransparent member described before so as to transmit the laser. This container 304 is used as follows, for example.

That is, first, a polymer solution 344 and a reservoir solution 345 are put into the plurality of first chambers 341 and the second chamber 342, respectively. As indicated with arrows in FIG. 19B, water vapor generated from the polymer solution 344 then passes through the passages 343 to move to the second chamber 342. This vapor diffusion promotes evaporation of the solvent of the polymer solution 344. Since the passages 343 are different in length from each other, the vapor diffusion conditions are different in the respective first chambers 343. Accordingly, when crystalline nuclei have been generated in a plurality of first chambers, they are allowed to grow thereafter and thereby intended polymer crystals can be obtained. On the other hand, with respect to first chambers in which no crystalline nuclei have been generated, the crystallization conditions employed therein can be judged to be unsuitable. Furthermore, after the polymer solution 344 is brought into a supersaturation state, crystalline nuclei may be generated forcibly by pulsed laser irradiation as described before. When crystalline nuclei have been generated, they are allowed to grow and thereby intended polymer crystals can be obtained. On the other hand, when no crystalline nuclei have been generated, the crystallization conditions used thereby are judged to be inappropriate, and crystallization is attempted under the next conditions.

The diameters of the passages were varied in Example 11 while the lengths of the passages were varied in Example 12. However, a combination thereof may be employed. Furthermore, a plurality of at least one of the container according to Example 11, the container according to Example 12, and a container that is a combination thereof may be formed in one plate. The conditions such as the size of this plate, etc. are the same as in, for instance, the plate of Example 10.

Example 13

Figure 20:
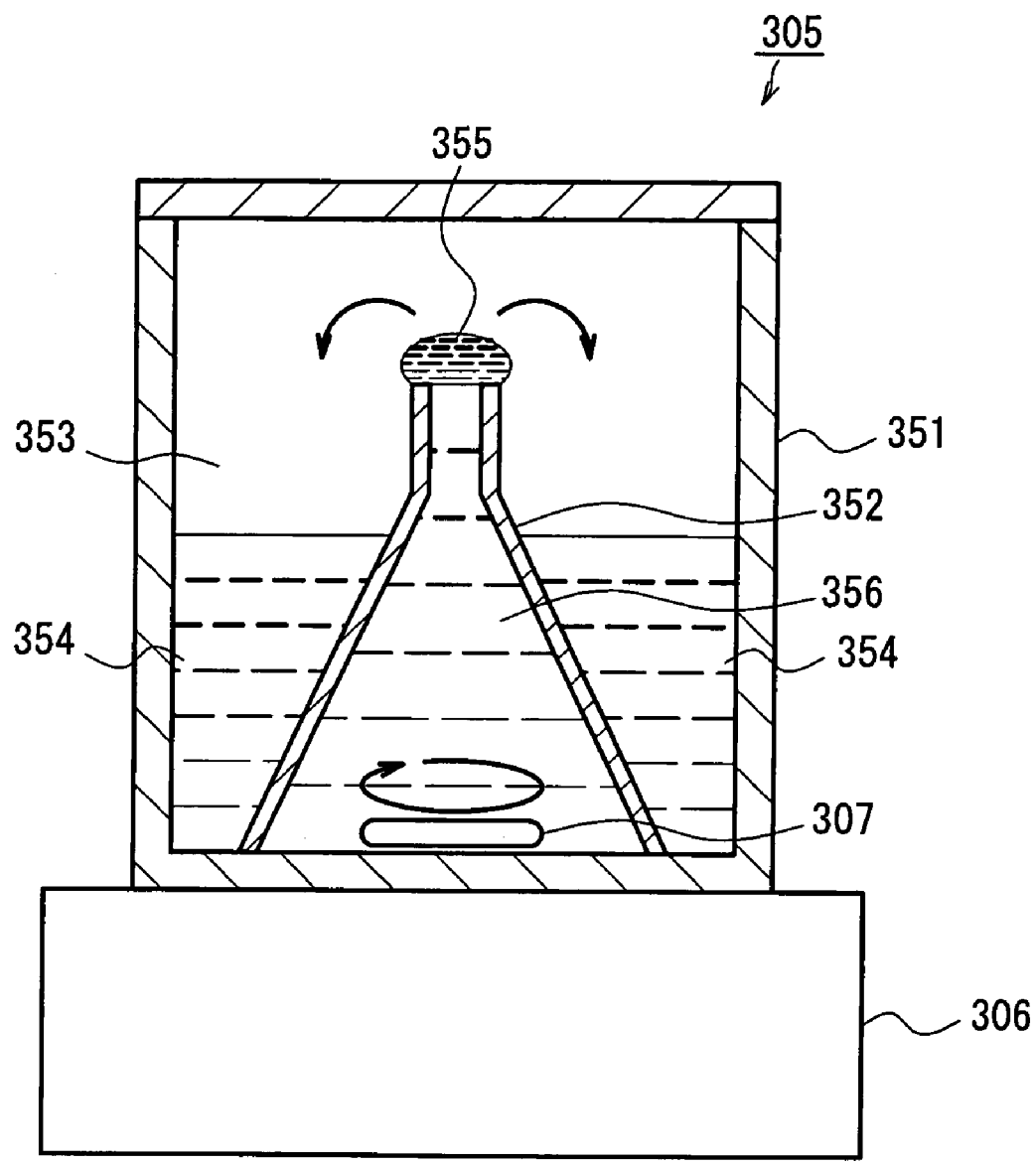
FIG. 20 is a cross sectional view showing yet another example of the container according to the present invention.

An example of the third container according to the present invention is shown in FIG. 20. As shown in FIG. 20, this container 305 has a configuration in which a small container 352 is disposed in a large container 351. The large container 351 has a cylindrical shape and the top thereof is covered with a lid. The small container 352 is formed of a body part of a reverse truncated cone shape (a large volume part) and a cylindrical part (a small volume part) joined to the upper part of the body part. The end of said cylindrical part is open. The space formed between the inner wall of the large container 351 and the outer wall of the small container 352 is a second chamber in which a reservoir solution 354 is put. The inside of the small container 51 or the vicinity of the opening provided at the end of the cylindrical part serves as a first chamber in which a polymer solution 355 is put or is retained. The size of this container 305 is not particularly limited. With respect to the size of the large container 351, it has, for instance, an inner diameter of 3 to 30 mm and a depth of 5 to 100 mm, preferably an inner diameter of 5 to 25 mm and a depth of 10 to 50 mm, and more preferably an inner diameter of 10 to 20 mm and a depth of 10 to 30 mm.

With respect to the size of the small container 352, the body part of a reverse truncated cone shape (a large volume part) has, for instance, a maximum inner diameter of 3 to 30 mm, a minimum inner diameter of 0.3 to 5 mm, and a height of 4 to 90 mm while the cylindrical part (the small volume part) has, for instance, an inner diameter of 0.3 to 5 mm and a height of 0.1 to 5 mm. Preferably, the body part of a reverse truncated cone shape (a large volume part) has a maximum inner diameter of 5 to 25 mm, a minimum inner diameter of 0.5 to 3 mm, and a height of 9 to 45 mm while the cylindrical part (the small volume part) has an inner diameter of 0.5 to 3 mm and a height of 0.1 to 3 mm. More preferably, the body part of a reverse truncated cone shape (a large volume part) has a maximum inner diameter of 10 to 20 mm, a minimum inner diameter of 1 to 2 mm, and a height of 9 to 25 mm while the cylindrical part (the small volume part) has an inner diameter of 1 to 2 mm and a height of 0.1 to 2 mm. Furthermore, the material of the container 305 is not particularly limited but for example, resin or glass can be used. With this container, when laser beam irradiation is to be carried out, the portion through which laser beam passes is formed of a transparent or semitransparent member. Examples of such a member can include those described before. This container 305 is used as follows, for example.

That is, first, a reservoir solution 354 is put into the large container 351 (the chamber 353) and the small container 352 is filled with an immiscible hyperbaric solution 356. A magnet stirring element 307 is placed in the bottom of the small container 352. A droplet of a polymer solution 355 is placed on the end of the cylindrical part of the small container 352. In this state, the container 305 is placed on a magnet stirrer 306 and the stirring element 307 is rotated. Thereby the generation of water vapor from the polymer solution 355 is promoted by the effect of the reservoir solution 354. Furthermore, the stirring element 307 rotates to stir the immiscible hyperbaric solution 356. The vibration generated thereby also is transmitted to the polymer solution 355 and accordingly, the polymer solution 355 also is stirred indirectly. As a result, the generation of crystalline nuclei is promoted. When crystalline nuclei of the polymer solution have been generated, they may be grown thereafter and thereby intended crystals may be obtained. On the other hand, when no crystalline nuclei have been generated, the conditions employed thereby are judged to be unsuitable as the crystallization conditions and crystallization may be attempted under the next conditions. Further, after being brought into a supersaturation state, the polymer solution 355 may be irradiated with a laser beam. Moreover, a plurality of containers according to this example may be formed in one plate. The conditions thereof are the same as in, for instance, the plate according to Example 10.

INDUSTRIAL APPLICABILITY

As described above, the process of the present invention is useful for screening or producing a crystal of an organic substance such as protein.

The invention claimed is:

1. A process for producing a crystalline nucleus, wherein the crystalline nucleus is generated by irradiating a solution in which a solute to be crystallized has dissolved, with at least one pulsed laser selected from a picosecond pulsed laser and a femtosecond pulsed laser.

2. The production process according to claim 1, wherein the crystalline nucleus is generated by focusing the pulsed laser in the solution with a lens and causing a local explosion phenomenon once or more in a position on which the pulsed laser is focused.

3. The production process according to claim 1, wherein when the laser irradiation is carried out once, the pulsed laser has a pulse peak power of at least $5\times10^5$ (watt).

4. The production process according to claim 1, wherein when the laser irradiation is carried out once, the pulsed laser has a pulse energy of at least 60 nJ/pulse.

5. The production process according to claim 1, wherein when the laser irradiation is carried out at 1000 pulses or more per second, the pulsed laser has a pulse peak power of at least $1\times10^4$ (watt).

6. The production process according to claim 1, wherein when the laser irradiation is carried out at 1000 pulses or more per second, the pulsed laser has a pulse energy of at least 1.95 nJ/pulse.

7. The production process according to claim 1, wherein the number of times the solution is irradiated with the pulsed laser is a single shot to 10 million shots.

8. The production process according to claim 1, wherein the solution is a supersaturated solution.

9. A process for producing a crystal, wherein a crystalline nucleus is allowed to be generated in a solution by a process according to claim 1 and then a crystal is grown thereon.

10. The production process according to claim 9, wherein a solute to be crystallized is an organic substance.

11. The production process according to claim 9, wherein a solute to be crystallized is protein.

12. The production process according to claim 9, wherein a container including the solution is allowed to make a movement to stir the solution and thereby the crystal is generated and grown.

13. The production process according to claim 12, wherein the movement is a movement selected from rotation, vibration, and rocking or a movement in which two or more of them are combined together.

14. The production process according to claim 12, wherein the container is a well plate including a plurality of wells, and each of the wells contains the solution.

15. The production process according to claim 12, wherein the solution is brought into a supersaturation state by evaporating a solvent contained in the solution or changing temperature of the solution.

16. The production process according to claim 12, wherein a liquid with a higher specific gravity than that of the solution is put in the container, and the crystal is grown at an interface between the liquid with a higher specific gravity and the solution.

17. The production process according to claim 12, wherein another container is prepared that contains a reservoir solution in which components other than the solute of the solution have dissolved at higher concentrations than in the solution, and then a crystal of the solute is generated and grown in a state where water vapor can move between the another container and the container including the solute.

* * * * *